US012564028B2

(12) United States Patent
Ho et al.

(10) Patent No.: US 12,564,028 B2
(45) Date of Patent: Feb. 24, 2026

(54) DIELECTRIC LAYERS HAVING NITROGEN-CONTAINING CRUSTED SURFACES

(71) Applicant: Taiwan Semiconductor Manufacturing Company, Ltd., Hsin-Chu (TW)

(72) Inventors: Tsai-Jung Ho, Changhua County (TW); Po-Cheng Shih, Hsin Chiu (TW); Tze-Liang Lee, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 797 days.

(21) Appl. No.: 17/833,395

(22) Filed: Jun. 6, 2022

(65) Prior Publication Data

US 2023/0290674 A1     Sep. 14, 2023

Related U.S. Application Data

(60) Provisional application No. 63/318,462, filed on Mar. 10, 2022.

(51) Int. Cl.
*H01L 21/768* (2006.01)
*H01L 23/522* (2006.01)

(52) U.S. Cl.
CPC .. *H01L 21/76802* (2013.01); *H01L 21/76826* (2013.01); *H01L 21/76831* (2013.01);
(Continued)

(58) Field of Classification Search
CPC ......... H01L 21/76802; H01L 21/76826; H01L 21/76831; H01L 21/6879; H01L 21/76897;
(Continued)

(56) References Cited

U.S. PATENT DOCUMENTS

2018/0033728 A1    2/2018  Zhang et al.
2018/0182613 A1*   6/2018  Blanquart ........... H01L 21/0228
(Continued)

FOREIGN PATENT DOCUMENTS

KR     20210106334 A    8/2021
TW       201816940 A    5/2018
(Continued)

*Primary Examiner* — Marlon T Fletcher
*Assistant Examiner* — Christina A Sylvia
(74) *Attorney, Agent, or Firm* — HAYNES AND BOONE, LLP

(57) ABSTRACT

Interconnect structures having dielectric layers with nitrogen-containing crusts and methods of fabrication thereof are disclosed herein. An exemplary method includes forming a first interconnect opening in a first interlayer dielectric (ILD) layer that exposes an underlying conductive feature, such as a source/drain, a gate, a contact, a via, or a conductive line. The method includes nitridizing sidewalls of the first interconnect opening, which are formed by the first ILD layer, before forming a first metal contact in the first interconnect opening. The nitridizing converts a portion of the first ILD layer into a nitrogen-containing crust. The first metal contact can include a metal plug and dielectric spacers between the metal plug and the nitrogen-containing crust of the first ILD layer. The method can include forming a second interconnect opening in a second ILD layer that exposes the first metal contact and forming a second metal contact in the second interconnect opening.

20 Claims, 18 Drawing Sheets

(52) U.S. Cl.
CPC .. *H01L 21/76879* (2013.01); *H01L 21/76897* (2013.01); *H01L 23/5226* (2013.01)

(58) Field of Classification Search
CPC ......... H01L 21/76805; H01L 21/76895; H01L 21/28518; H01L 21/76814; H01L 21/76877; H01L 23/5226; H01L 23/485; H10D 84/0149
See application file for complete search history.

(56) References Cited

U.S. PATENT DOCUMENTS

2020/0035549 A1 * 1/2020 Wu .................. H01L 21/76832
2021/0257293 A1   8/2021 Lee et al.
2022/0359411 A1 * 11/2022 Ho .................. H01L 23/53295

FOREIGN PATENT DOCUMENTS

TW        202015106  A     4/2020
TW        202112590  A     6/2021
TW        202145583  A    12/2021

* cited by examiner

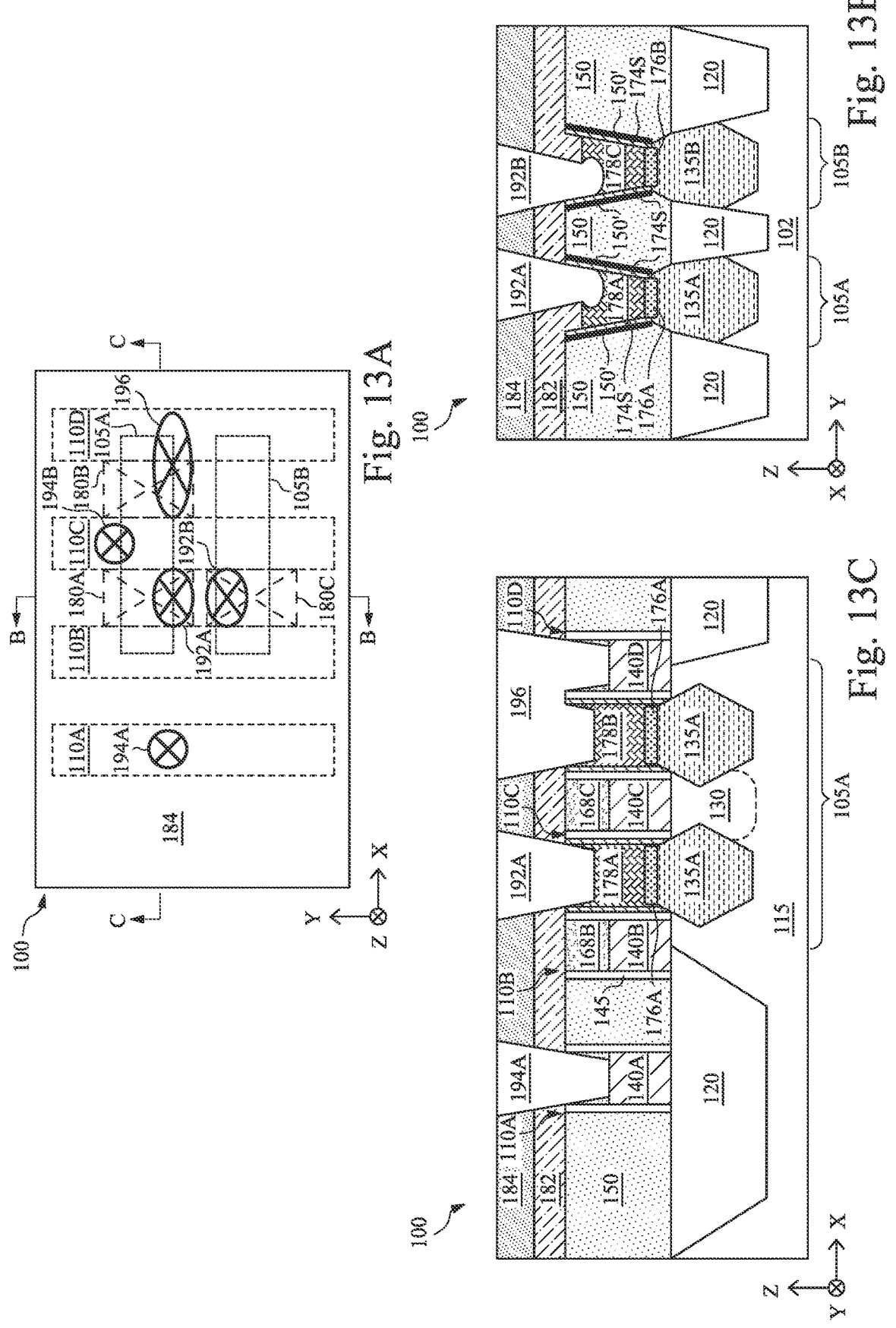

DIELECTRIC LAYERS HAVING NITROGEN-CONTAINING CRUSTED SURFACES

The present application is a non-provisional application of and claims benefit of U.S. Provisional Patent Application Ser. No. 63/318,462, filed Mar. 10, 2022, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, resistance-capacitance (RC) delay has arisen as a significant challenge as reduced geometry sizes are implemented to achieve ICs with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. Interconnects of ICs, which physically and/or electrically connect IC components and/or IC features of the ICs, are particularly problematic in their contributions to RC delay, particularly as distances between adjacent interconnects continue to decrease as IC technology nodes scale. A need thus exists for improvements in interconnects of ICs and/or methods of fabricating interconnects of ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-13A are fragmentary top plan views of a device, in portion or entirety, at various fabrication stages of interconnect structures thereof having dielectric layers with nitrogen-containing crusts (such as those associated with the method of FIG. 1) according to various aspects of the present disclosure.

FIGS. 2B-13B and FIGS. 2C-13C are diagrammatic cross-sectional views of the device of FIGS. 2A-13A, respectively, in portion or entirety, at various fabrication stages of the interconnect structure according to various aspects of the present disclosure.

DETAILED DESCRIPTION

Figure 1:
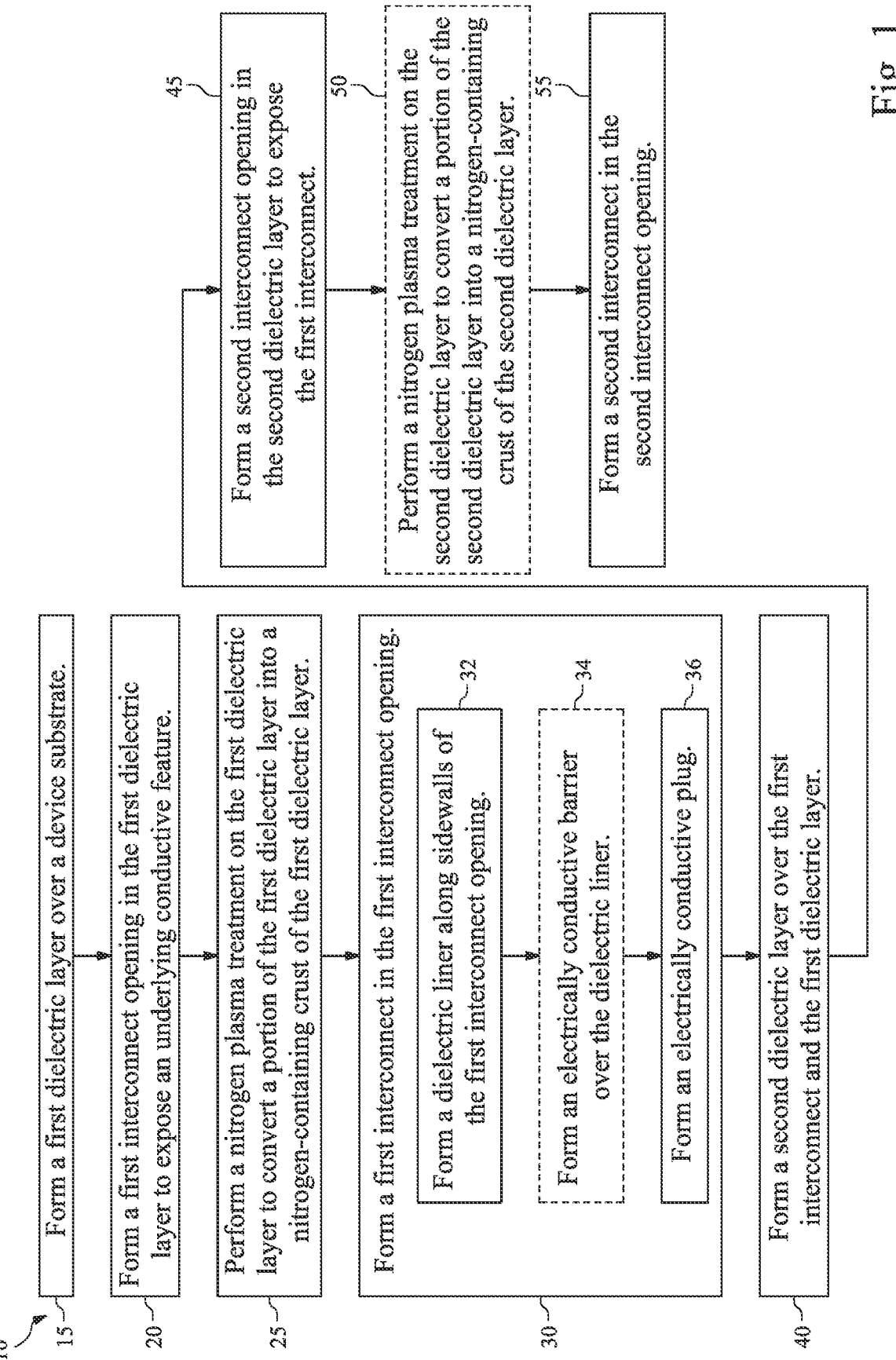
FIG. 1 is a flow chart of a method, in portion or entirety, for fabricating an interconnect structure having a dielectric layer with a nitrogen-containing crust according to various aspects of the present disclosure.

The present disclosure relates generally to integrated circuit (IC) devices, and more particularly, to interconnect structures for IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Typically, scaling down has been limited only by an ability to lithographically define IC features at ever-decreasing geometry sizes. However, resistance-capacitance (RC) delay has arisen as a significant challenge as reduced geometry sizes are implemented to achieve ICs with faster operating speeds (for example, by reducing distances traveled by electrical signals), thereby negating some of the advantages achieved by scaling down and limiting further scaling. For example, as IC technology nodes expand into 20 nm and below, shrinking critical dimensions (CDs) at IC device layers (for example, gate lengths, gate pitches, fin pitches, etc.) have led to corresponding shrinking in interconnect CDs (for example, device-level contact dimensions, via dimensions, metal line dimensions, device-level contact pitches, via pitches, metal line pitches, etc.) of multi-layer interconnect (MLI) features of the ICs. Shrinking interconnects are becoming increasingly problematic when considering their contribution to RC delay. Solutions for reducing both resistance and capacitance associated with interconnects are thus desired to reduce RC delay and optimize performance of scaled down ICs.

RC delay generally indicates delay in electrical signal speed through an IC resulting from a product of resistance (R), a material's opposition to flow of electrical current, and capacitance (C), a material's ability to store electrical charge. For any two adjacent interconnects, capacitance is a function of a dielectric constant of dielectric material surrounding the two interconnects and a distance between the interconnects. Since decreased distances (spacing) between interconnects results from scaling down ICs (and thus results in increased capacitance), capacitance reduction techniques have focused on reducing a dielectric constant of insulating material of the interconnects. For example, low-k dielectric materials, such as dielectric materials having dielectric constants less than silicon dioxide ($SiO_2$), have been developed that reduce parasitic capacitance and/or capacitive coupling between interconnects and adjacent conductive features, such as adjacent interconnects or adjacent device features (for example, gates). Reducing resistance associated with interconnects has been achieved by implementing interconnect materials and/or interconnect configurations that decrease resistance and/or facilitate increased electrical current flow. For example, since copper interconnects exhibit lower electrical resistance, higher conductivity, and higher resistivity to electromigration than aluminum interconnects, aluminum interconnects are often replaced with copper interconnects to reduce RC delay and thereby increase IC speed. Other metal materials, such as tungsten, cobalt, ruthenium, molybdenum, or combinations thereof, have also been implemented to lower interconnect resistance and/or improve performance thereof.

Even so, metal ions/atoms of interconnects can diffuse easily into the low-k dielectric material and undesirably form electrical connections between interconnects. Closely spaced interconnects, such as those needed for scaled IC technology nodes, are especially susceptible to interconnect-to-interconnect leakage paths and/or interconnect-to-interconnect shorts that form because of metal ions/atoms diffusing/penetrating into their surrounding low-k dielectric material. Diffusion/barrier layers can be integrated in the interconnects to reduce (or prevent) metal atoms/ions from diffusing from metal layers of the interconnects into the low-k dielectric material. However, such integration reduces dimensions and/or volumes of electrically conductive portions, such as the metal layers, of the interconnects, which undesirably increases interconnect resistance. Further, fluorine-based processes, such as deposition processes that use fluorine-based precursors and/or etching processes that use fluorine-based etchants, can damage the low-k dielectric material, diffusion/barrier layers, and/or underlying conductive features, which can further degrade the interconnects' metal blocking capabilities.

To address these challenges, the present disclosure proposes interconnects having interlayer dielectric (ILD) layers with nitrogen-containing crusts, where the nitrogen-containing crusts are between electrically conductive portions of the interconnects (e.g., metal plugs thereof) and the ILD layers. Nitrogen-containing crusts can improve the interconnects' metal blocking properties without reducing dimensions, volumes, or contact areas of the interconnects' electrically conductive portions. The disclosed nitrogen-containing crusts are resistant to metal penetration/diffusion and exhibit better metal blocking capabilities than ILD layers without nitrogen-containing crusts. The disclosed nitrogen-containing crusts are also resistant to fluorine attack, such as those that may arise from fluorine-based metal deposition precursors and/or fluorine-based etchants. Interconnects disclosed herein thus exhibit improved metal blocking capabilities and/or fluorine resistance without increasing interconnect resistance, thereby improving overall performance of devices having such interconnects. The interconnects and methods of fabrication thereof are described in detail below. Different embodiments may have different advantages, and no particular advantage is required of any embodiment.

Turning to FIG. 1, FIG. 1 is a flow chart of a method 10, in portion or entirety, for fabricating an interconnect structure having a dielectric layer with a nitrogen-containing crust according to various aspects of the present disclosure. At block 15 and block 20, method 10 includes forming a first dielectric layer (e.g., an interlayer dielectric (ILD) layer) over a device substrate and forming a first interconnect opening in the first dielectric layer to expose an underlying conductive feature. The underlying conductive feature can be a device feature, such as a gate or a source/drain, or an interconnect feature, such as a contact, a via, or a conductive line of a multilayer interconnect (MLI). At block 25, a nitrogen plasma treatment is performed on the first dielectric layer to convert a portion of the first dielectric layer into a nitrogen-containing crust. The first dielectric layer thus has untreated portions and treated portions (e.g., nitrogen-containing crust). The nitrogen-containing crust of the first dielectric layer forms sidewalls of the first interconnect opening. At block 30, a first interconnect is formed in the first interconnect opening. For example, a dielectric liner (e.g., contact spacers) is formed along sidewalls of the first interconnect opening at block 32, an electrically conductive diffusion/adhesion barrier is formed in the first interconnect opening over the dielectric liner at block 34, and an electrically conductive plug is formed in the first interconnect opening at block 36. In some embodiments, the dielectric liner and/or the electrically conductive diffusion/adhesion barrier are omitted from the first interconnect. In some embodiments, a capping layer is formed over the electrically conductive plug. At block 40, a second dielectric layer is formed over the first interconnect and the first dielectric layer. The second dielectric layer can include an ILD layer disposed over an etch stop layer. At block 45, a second interconnect opening is formed in the second dielectric layer to expose the first interconnect. At block 50, method 10 includes performing a nitrogen plasma treatment on the second dielectric layer to convert a portion of the second dielectric layer into a nitrogen-containing crust. The second dielectric layer thus has untreated portions and treated portions (e.g., nitrogen-containing crust). The nitrogen-containing crust of the second dielectric layer, which may be a portion of the ILD layer but not the CESL, forms sidewalls of the second interconnect opening. At block 55, a second interconnect is formed in the second interconnect opening. In some embodiments, the nitrogen plasma treatment is not performed on the second dielectric layer. Additional steps can be provided before, during, and after method 10, and some of the steps described can be moved, replaced, or eliminated for additional embodiments of method 10.

FIGS. 2A-13A are fragmentary top plan views of a device 100, in portion or entirety, at various fabrication stages of an interconnect structure thereof (such as those associated with method 10 of FIG. 1) according to various aspects of the present disclosure. FIGS. 2B-13B and FIGS. 2C-13C are fragmentary diagrammatic cross-sectional views of device 100, in portion or entirety, at various fabrication stages of the interconnect structure according to various aspects of the present disclosure. FIGS. 2B-13B are taken along lines B-B of FIGS. 2A-13A, and FIGS. 2C-13C are taken along lines C-C of FIGS. 2A-13A. FIGS. 2B-13B and FIGS. 2C-13C provide y-z cross-sectional views and x-z cross-sectional views, respectively, and can thus be referred to as y-cuts and x-cuts, respectively. A lengthwise direction of active regions of device 100 is along the x-direction and a lengthwise direction of gates of device 100 is along the y-direction. Device 100 may be included in a microprocessor, a memory, an integrated circuit (IC) device, or combinations thereof. In some embodiments, device 100 is a portion of an IC chip and/or a system-on-chip (SoC) that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2A-13A, FIGS. 2B-13B, and FIGS. 2C-13C have been simplified for the sake of clarity to better understand the inventive concepts of the present disclosure. Additional features can be added in device 100, and some of the features described below can be replaced, modified, or eliminated in other embodiments of device 100.

Figures 2A, 2B, 2C:
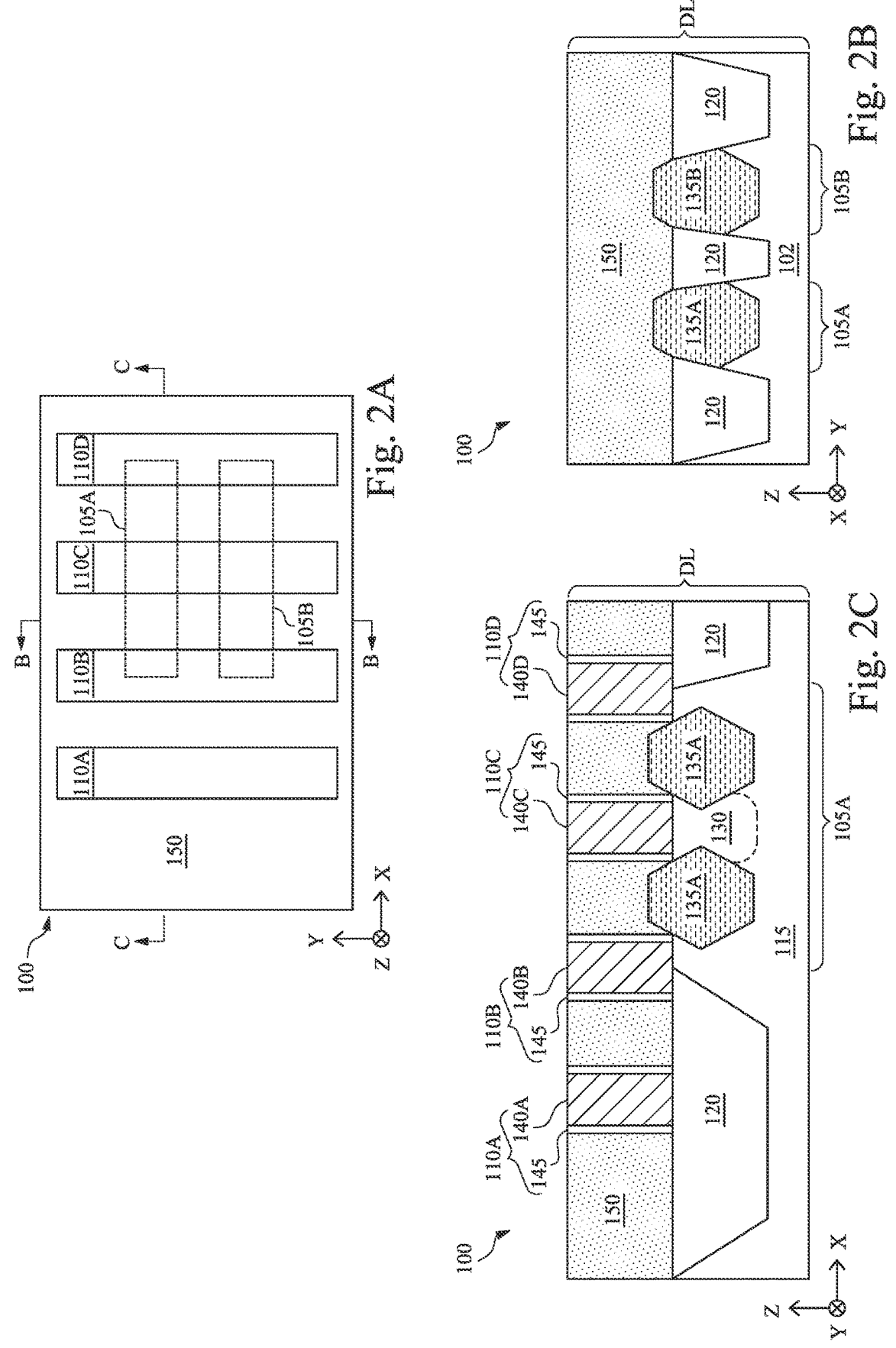

Turning to FIGS. 2A-2C, device 100 includes a device layer DL having two active (OD) regions, such as an active region 105A and an active region 105B, and four gate (poly) lines, such as a gate line 110A, a gate line 110B, a gate line 110C, and a gate line 110D, over a substrate (wafer) 115. Substrate 115 includes an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as SiGe, GaAsP, AlInAs, AlGaAs, GaInAs, GaInP, GaInAsP, or combinations thereof; or combinations thereof. In the depicted embodiment, substrate 115 includes silicon. Substrate 115 can include various doped regions therein, such as p-type doped regions (e.g., p-wells), n-type doped regions (e.g., n-wells), or combinations thereof. N-wells include n-type dopants, such as phosphorus, arsenic, other n-type dopant, or combinations thereof. P-wells include p-type dopants, such as boron, indium, other p-type dopant, or combinations thereof. In some embodiments, doped regions formed in substrate 115 include a combination of p-type dopants and n-type dopants. The various doped regions can be formed directly on and/or in substrate 115, for example, to provide a p-well structure, an n-well structure, a dual-well structure, a raised structure, or combinations thereof.

Active region 105A and active region 105B are oriented substantially parallel to one another and extend lengthwise along the x-direction (i.e., length is along the x-direction, width is along the y-direction, and height is along the z-direction). Isolation features 120 isolate active region 105A and active region 105B from one another and other active and/or passive device regions of device 100. In some embodiments, isolation features 120 surround active region 105A and active region 105B. Isolation features 120 include silicon oxide, silicon nitride, silicon oxynitride, other suitable isolation material (including, for example, silicon, oxygen, nitrogen, carbon, or other suitable isolation constituent), or combinations thereof. In some embodiments, isolation features 120 include a bulk dielectric layer (e.g., an oxide layer) disposed over a dielectric liner (e.g., a silicon nitride liner). In some embodiments, isolation features 120 include a dielectric layer disposed over a doped liner (including, for example, boron silicate glass (BSG) and/or phosphosilicate glass (PSG)). Isolation features 120 can be configured as shallow trench isolation (STI) structures, deep trench isolation (DTI) structures, local oxidation of silicon (LOCOS) structures, other suitable isolation structures, or combinations thereof).

Active region 105A and active region 105B include channel regions, source regions, and drain regions. Source regions and drain regions are collectively referred to as source/drain regions. In the depicted embodiment, active region 105A and active region 105B are planar-based active regions. For example, channel regions are formed in portions of substrate 115 (e.g., channel layers 130) and source/drain regions are formed in epitaxial source/drains (e.g., epitaxial source/drains 135A and/or epitaxial source/drains 135B). Active region 105A has a respective channel layer 130 extending between respective epitaxial source/drains 135A, and active region 105B has a respective channel layer 130 extending between respective epitaxial source/drains 135B. Gate lines 110A-110D are disposed on respective channel layers 130 and between respective epitaxial source/drains 135A, 135B, such as gate line 110C disposed on a respective channel layer 130 (e.g., on a portion of substrate 115 in which a channel is formed) and between respective epitaxial source/drains 135A. Active region 105A and active region 105B are thus planar-based active regions, and device layer DL includes planar transistors (i.e., transistors having channels formed in a substrate between respective source/drains and respective gate stacks disposed on the channels). In some embodiments, active regions 105A, 105B are GAA-based active regions, and device layer DL includes GAA transistors. In such embodiments, source/drain regions of active regions 105A, 105B are formed in epitaxial source/drains 135A, 135B, channel regions of active regions 105A, 105B are formed in semiconductor layers suspended over substrate 115 and extending between respective epitaxial source/drains 135A, 135B, and gate lines 110A-110D are disposed on and surround the suspended semiconductor layers (i.e., suspended channel layers). In some embodiments, active regions 105A, 105B are FinFET-based active regions, and device layer DL includes FinFET transistors. In such embodiments, source/drain regions of active regions 105A, 105B are formed in epitaxial source/drains 135A, 135B, channel regions of active regions 105A, 105B are formed in semiconductor fins extending from substrate 115 and between respective epitaxial source/drains 135A, 135B, and gate lines 110A-110D are disposed on and wrap the channel regions of the semiconductor fins (i.e., fin channel layers). Device layer DL can be configured with planar transistors and/or non-planar transistors depending on design requirements.

Epitaxial source/drains 135A, 135B include silicon, germanium, other suitable semiconductor material, or combinations thereof. Epitaxial source/drains 135A, 135B are doped with n-type dopants and/or p-type dopants. In some embodiments (for example, for n-type transistors), epitaxial source/drains 135A, 135B include silicon doped with carbon, phosphorous, arsenic, other n-type dopant, or combinations thereof (for example, Si:C epitaxial source/drains, Si:P epitaxial source/drains, or Si:C:P epitaxial source/drains). In some embodiments (for example, for p-type transistors), epitaxial source/drains 135A, 135B include silicon germanium or germanium doped with boron, other p-type dopant, or combinations thereof (for example, Si:Ge:B epitaxial source/drains). In some embodiments, epitaxial source/drains 135A, 135B include materials and/or dopants that achieve desired tensile stress and/or compressive stress in respective channel regions, such as channel layers 130. In some embodiments, epitaxial source/drains 135A and epitaxial source/drain features 135B have the same compositions. In some embodiments, epitaxial source/drains 135A and epitaxial source/drain features 135B have different compositions. For example, epitaxial source/drain features 135A may form portions of first type transistors and have a first composition that optimizes performance of first type transistors (e.g., Si:C for n-type transistors), and epitaxial source/drain features 135B may form portions of second type transistors and have a second composition that optimizes performance of second type transistors (e.g., Si:Ge:B for p-type transistors).

Gate lines 110A-110D are oriented substantially parallel to one another and extend lengthwise along the y-direction (i.e., length is along the y-direction, width is along the x-direction, and height is along the z-direction). Gate lines 110A-110D are oriented substantially orthogonal to active region 105A and active region 105B. Gate lines 110A-110D (also referred to as gate structures) each include a gate stack (e.g., a gate stack 140A, a gate stack 140B, a gate stack 140C, and a gate stack 140D, respectively) and gate spacers 145 disposed along sidewalls of the gate stack. Gate stacks 140A-140D are disposed over channel regions of active region 105A and/or active region 105B (i.e., respective channel layers 130) and are further disposed between respective source/drain regions of active region 105A and/or active region 105B (i.e., respective epitaxial source/drains 135A, 135B). In the x-z plane, gate stacks 140A-140D cover top surfaces of channel layers 130. In the y-z plane, gate stacks 140A-140D cover top surfaces, bottom surfaces, sidewalls, or combinations thereof of channel layers 130 depending on whether transistors of device 100 are planar transistors or non-planar transistors (for example, gate stacks 140A-140D wrap channel layers of FinFETs and/or surround channel layers of GAAs). In FIGS. 2A-2C, gate stack 140C engages channel layer 130, such that current can flow between respective epitaxial source/drain features 135A, respectively, during operation.

Gate stacks 140A-140D (also referred to as metal gates and/or high-k/metal gates) are configured to achieve desired functionality according to design requirements. Gate stacks 140A-140D can include a gate dielectric (e.g., a gate dielectric layer) and a gate electrode (e.g., a work function layer and a bulk conductive layer) over the gate dielectric. Gate stacks 140A-140D can include numerous other layers, such as capping layers, interface layers, diffusion layers, barrier layers, hard mask layers, or combinations thereof. Gate dielectrics and/or gate electrodes of gate stacks 140A-140D can include the same or different numbers of layers, configurations of layers, materials of layers, or combinations thereof.

Gate dielectrics of gate stacks 140A-140D include a high-k dielectric layer, which includes a high-k dielectric material, such as a dielectric material having a dielectric constant that is greater than that of silicon dioxide. For example, the high-k dielectric layer includes $HfO_2$, $HfSiO$, $HfSiO_4$, $HfSiON$, $HfLaO$, $HfTaO$, $HfSiO$, $HfZrO$, $HfAlO$, $ZrO$, $ZrO_2$, $ZrSiO_2$, $AlO$, $AlSiO$, $Al_2O_3$, $TiO$, $TiO_2$, $LaO$, $LaSiO$, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material for metal gate stacks, or combinations thereof. In some embodiments, gate dielectrics include an interfacial layer disposed between the high-k dielectric layer and the channel region. The interfacial layer includes a dielectric material, such as $SiO_2$, $HfSiO$, $SiON$, other suitable dielectric material, or combinations thereof.

Gate electrodes of gate stacks 140A-140D include a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrodes include a work function layer and a bulk conductive layer. The work function layer can be a metal layer tuned to have a desired work function (e.g., an n-type work function or a p-type work function), and the bulk layer can be a bulk metal layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof.

Gate spacers 145 are disposed adjacent to gate stacks 140A-140D. Gate spacers 145 include a dielectric material, which can include silicon, oxygen, carbon, nitrogen, other suitable material, or combinations thereof (e.g., silicon oxide, silicon nitride, silicon oxynitride, silicon carbide, silicon carbonitride, silicon oxycarbide, silicon oxycarbonitride, or combinations thereof). In some embodiments, gate spacers 145 include a multilayer structure, such as a first dielectric layer that includes silicon oxide and a second dielectric layer that includes silicon nitride. In some embodiments, gate spacers 145 include more than one set of spacers, such as seal spacers, offset spacers, sacrificial spacers, dummy spacers, and/or main spacers.

An interlayer dielectric (ILD) layer 150 is disposed over substrate 115 and between adjacent gate lines 110A-110D. In the depicted embodiment, ILD layer 150 is a dielectric layer that includes silicon and oxygen. For example, ILD layer 150 is an $SiO_x$ layer, where x is a number of oxygen atoms. In some embodiments, the $SiO_x$ layer is a porous silicon oxide layer, which can be configured to have a dielectric constant less than about 2.5. In another example, ILD layer 150 is a carbon-doped oxide layer (i.e., an SiOC layer). The carbon-doped oxide layer can include an SiOCH-based material having, for example, $Si—CH_3$ bonds and/or can be configured to have a dielectric constant less than about 2.5. In some embodiments, ILD layer 150 is a low-k dielectric layer (i.e., ILD layer 150 includes a dielectric material having a dielectric constant that is lower than a dielectric constant of silicon dioxide (k≈3.9)) or an extreme low-k (ELK) dielectric layer (i.e., ILD layer 150 includes a dielectric material having a dielectric constant less than about 2.5). In some embodiments, ILD layer 150 includes silicon oxide, carbon-doped oxide, silicon nitride, silicon oxynitride, tetraethylorthosilicate (TEOS), PSG, BSG, boron-doped PSG (BPSG), fluorine-doped silicate glass (FSG), Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other suitable dielectric material, or combinations thereof. ILD layer 150 can include a multilayer structure having multiple dielectric materials.

A contact etch stop layer (CESL) may be disposed between ILD layer 150 and substrate 115, isolation features 120, epitaxial source/drains 135A, 135B, and gate spacers 145. CESL includes a material different than ILD layer 150, such as a dielectric material that is different than the dielectric material of ILD layer 150. For example, where ILD layer 150 includes silicon and oxygen (for example, $SiO_x$ or SiCOH), CESL can include silicon and nitrogen and/or carbon (for example, SiN, SiCN, SiCON, SiON, SiC, or combinations thereof). CESL can include a multilayer structure having multiple dielectric materials.

Figures 3A, 3B, 3C:
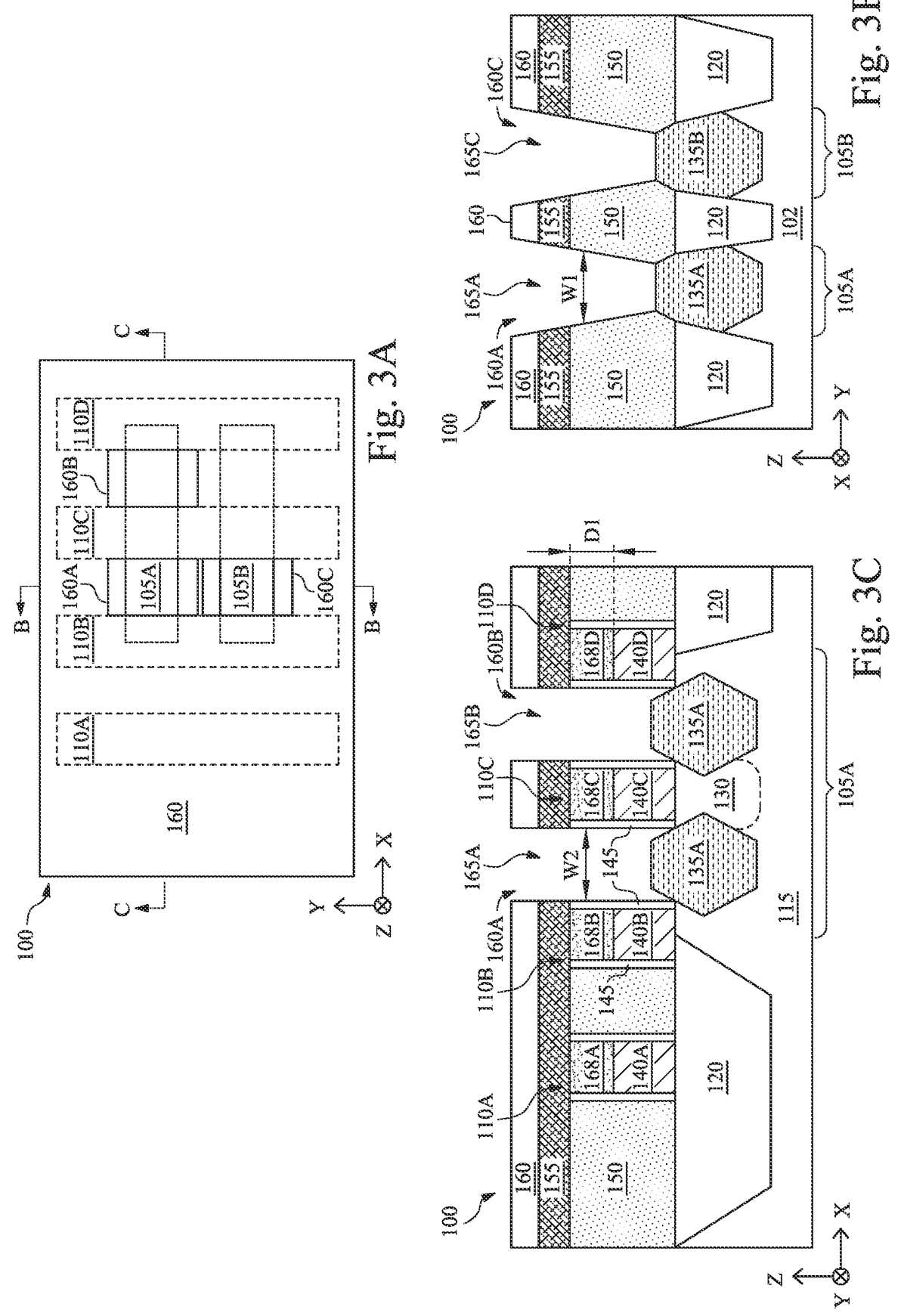

Turning to FIGS. 3A-3C, an ILD layer 155 is formed over ILD layer 150, a patterned mask layer 160 is formed over ILD layer 155, and source/drain contact openings 165A-165C are formed in ILD layer 155 and ILD layer 150 by a patterning process. Source/drain contact opening 165A and source/drain contact opening 165B extend through ILD layer 155 and ILD layer 150 to expose respective epitaxial source/drains 135A, and source/drain contact opening 165C extends through ILD layer 155 and ILD layer 150 exposes a respective epitaxial source/drain 135B. In the y-z plane (FIG. 3B), source/drain contact openings 165A-165C have bottoms formed by respective epitaxial source/drains 135A, 135B and sidewalls formed by ILD layer 155 and ILD layer 150. In the x-z plane (FIG. 3C), source/drain contact openings 165A-165C have bottoms formed by respective epitaxial source/drains 135A, 135B and sidewalls formed by ILD layer 155 and respective gate spacers 145. In some embodiments, in FIG. 3C, portions of ILD layer 150 remain between adjacent gate lines 110A-110D after the patterning process. In such embodiments, sidewalls of source/drain contact openings 165A-165C are formed by ILD layer 150 instead of or, in some embodiments, in addition to gate spacers 145.

Source/drain contact openings 165A-165C have a width W1 along the y-direction (FIG. 3B) and a width W2 along the x-direction (FIG. 3C). Source/drain contact openings 165A-165C have tapered sidewalls and trapezoidal cross-sectional profiles/shapes in the y-z plane (FIG. 3B) and substantially linear/vertical sidewalls and rectangular cross-sectional profiles/shapes in the x-z plane (FIG. 3C). In some embodiments, widths of source/drain contact openings 165A-165C decrease along their heights. For example, width W1 decreases from a first width at tops of source/drain contact openings 165A-165C (proximate top surface of ILD layer 155) to a second width at bottoms of source/drain contact openings 165A-165C (proximate top surfaces of epitaxial source/drains 135A, 135B). In some embodiments, source/drain contact openings 165A-165C having other shapes/profiles and/or sidewall profiles. In some embodiments, source/drain contact openings 165A-165C have different widths.

ILD layer 155 is configured and/or formed similar to ILD layer 150. For example, ILD layer 155 includes a dielectric material, which may be a same dielectric material as or a different dielectric material than ILD layer 150. A thickness of ILD layer 155 is less than ILD layer 150. ILD layer 155 is formed over ILD layer 150 and gate lines 110A-110D by chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low pressure CVD (LPCVD), atomic layer CVD (ALCVD), atmospheric pressure CVD (APCVD), plasma enhanced ALD (PEALD), other suitable method, or combinations thereof. In some embodiments, ILD layer 155 is an $SiO_x$ layer or an SiOC layer (i.e., ILD layer 155 includes silicon and oxygen) formed by PECVD. In some embodiments, a planarization process is performed on ILD layer 155 after deposition.

The patterning process can include performing a lithography process to form patterned mask layer 160 having openings 160A-160C therein over ILD layer 155 and an etching process to transfer a pattern defined in patterned mask layer 160 to ILD layer 155 and/or ILD layer 150. The lithography process can include forming a resist layer over ILD layer 155 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light), where the mask blocks, transmits, and/or reflects radiation to the resist layer depending on a mask pattern of the mask and/or mask type, such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The exposure process can be implemented or replaced by other methods, such as maskless lithography, electron-beam writing, and/or ion-beam writing.

The etching process removes portions of ILD layer 155 and/or ILD layer 150 exposed by openings 160A-160C of patterned mask layer 160. The etching process can include a dry etch (for example, a reactive ion etch (RIE)), a wet etch, other etch process, or combinations thereof. In some embodiments, the patterned resist layer is patterned mask layer 160, and the patterned resist layer is used as an etch mask. In some embodiments, a mask layer is formed over ILD layer 155 before forming the resist layer, the patterned resist layer is formed over the mask layer, and the patterned resist layer is used as an etch mask to remove portions of the mask layer formed over ILD layer 155. In such embodiments, the patterned mask layer is patterned mask layer 160, and the patterned mask layer is used as an etch mask. In some embodiments, the etching process removes ILD layer 155 and ILD layer 150 with a single etchant, such as where ILD layer 155 and ILD layer 150 have the same or substantially similar compositions. In some embodiments, the etching process removes ILD layer 155 and ILD layer 150 with different etchants, such as where ILD layer 155 and ILD layer 150 have different compositions. In some embodiments, the etching process is a multistep process. For example, a first etch selectively removes ILD layer 155 and ILD layer 150 relative to patterned mask layer 160 and an underlying CESL, and a second etch selectively removes CESL relative to ILD layer 155, ILD layer 150, and epitaxial source/drains 135A, 135B. The first etch stops upon reaching CESL, and the second etch stops upon reaching epitaxial source/drains 135A, 135B. In another example, a first etch selectively removes ILD layer 155 relative to patterned mask layer 160 and ILD layer 150, and a second etch selectively removes ILD layer 150 relative to epitaxial source/drains 135A, 135B and ILD layer 155. The first etch stops upon reaching ILD layer 150 and the second etch stops upon reaching epitaxial source/drains 135A, 135B.

In some embodiments, before depositing ILD layer 155, gate stacks 140A-140D are recessed and/or etched back, such that top surfaces of gate stacks 140A-140D are lower than top surface of ILD layer 150 (FIG. 3C), and self-aligned contact (SAC) features 168A-168D are formed over gate stacks 140A-140D, respectively. In such embodiments, a distance D1 is between top surfaces of gate stacks 140A-140D and top surface of ILD layer 150, and SAC features 168A-168D are below top surface of ILD layer 150, over top surfaces of gate stacks 140A-140D, respectively, and between respective gate spacers 145. In some embodiments, recessing/etching back gate stacks 140A-140D forms recesses (or openings) having sidewalls formed by gate spacers 145 and bottoms formed by top surfaces of recessed/etched back gate stacks 140A-140D, and SAC features 168A-168D are formed in the recesses. In some embodiments, recessing gate stacks 140A-140D includes removing hard masks of gate stacks 140A-140D. In such embodiments, an etching process may have an etching chemistry that is tuned to selectively etch a given dielectric material (i.e., hard masks) without (or minimally) etching other dielectric materials (i.e., ILD layer 150, gate spacers 145, or combinations thereof) and metal materials (i.e., gate electrodes of gate stacks 140A-140D). In some embodiments, recessing gate stacks 140A-140D includes etching back gate stacks 140A-140D by a dry etch, a wet etch, other suitable etch, or combinations thereof. The etching process may be configured to selectively etch gate stacks 140A-140D without (or minimally) etching ILD layer 150, gate spacers 145, or combinations thereof. For example, an etching chemistry can be tuned to selectively etch metal materials (i.e., gate electrodes of gate stacks 140A-140D) and/or high-k dielectric materials (i.e., gate dielectrics of gate stacks 140A-140D) without (or minimally) etching other dielectric materials (i.e., ILD layer 150, gate spacers 145, or combinations thereof). In some embodiments, gate spacers 145 are also recessed and/or etched back.

SAC features 168A-168D include a material that is different than ILD layer 150 and/or subsequently formed ILD layers to achieve etch selectivity during subsequent etching processes. In some embodiments, SAC features 168A-168D include silicon and nitrogen and/or carbon, such as silicon nitride, silicon oxynitride, silicon carbide, silicon oxycarbide, silicon carbonitride, silicon oxycarbonitride, other silicon nitride, other silicon carbide, or combinations thereof. In some embodiments, SAC features 168A-168D include metal and oxygen and/or nitrogen, such as aluminum oxide (e.g., AlO or $Al_2O_3$), aluminum nitride (e.g., AlN), aluminum oxynitride (e.g., AlON), zirconium oxide, zirconium nitride, hafnium oxide (e.g., HfO or $HFO_2$), zirconium aluminum oxide (e.g., ZrAlO), other metal oxide, other metal nitride, or combinations thereof. In some embodiments, SAC features 168A-168D include an amorphous semiconductor material, such as amorphous silicon. In some embodiments, SAC features 168A-168D are formed by depositing a SAC material over device 100 that fills recesses formed over gate stacks 140A-140D (e.g., recesses having sidewalls formed by gate spacers 145 and bottoms formed by recessed gate stacks 140A-140D) and planarizing the SAC material (e.g., by removing SAC material from top surface of ILD layer 150 by a chemical mechanical polishing (CMP) process). The SAC material is formed by CVD, PVD, ALD, HDPCVD, MOCVD, RPCVD, PECVD, LPCVD, ALCVD, APCVD, other suitable methods, or combinations thereof.

Figures 4A, 4B, 4C:
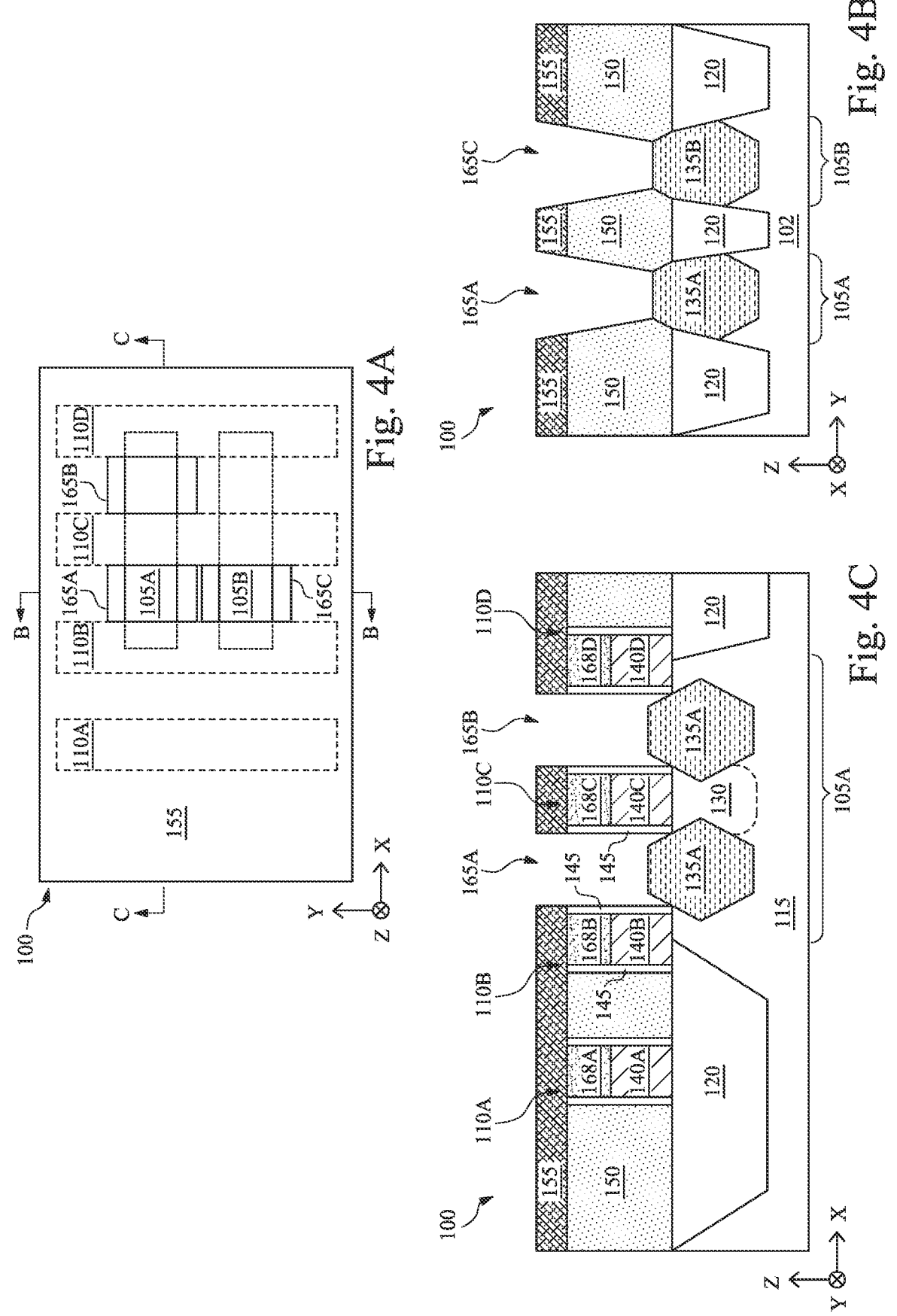

Turning to FIGS. 4A-4C, device 100 may undergo a cleaning process to remove native oxides, chemical oxides, other contaminants, or combinations thereof from device 100, such as those that may be on epitaxial source/drains 135A, 135B, ILD layer 150, ILD layer 155, or combinations thereof. The cleaning process may be a wet clean, a dry clean, other suitable clean, or combinations thereof. In some embodiments, the cleaning process is a dry clean that applies a dry clean gas (e.g., an etch gas) to device 100, including within source/drain contact openings 165A-165C. The dry clean gas can include a mixture of hydrofluoric acid (HF) and ammonia ($NH_3$). In such embodiments, the cleaning process is a chemical oxide removal (COR) process. The dry clean gas can include other gaseous mixtures. In some embodiments, the cleaning process is a wet clean that applies a wet clean solution to device 100, including within source/drain contact openings 165A-165C. The wet clean solution can include $H_2O$ (water) (which can be deionized water (DIW) or ozonated de-ionized water ($DIWO_3$)), ozone ($O_3$), $H_2SO_4$ (sulfuric acid), $H_2O_2$ (hydrogen peroxide), $NH_4OH$ (ammonium hydroxide), HCl (hydrochloric acid), HF, DHF (diluted HF), $HNO_3$ (nitric acid), $H_3PO_4$ (phosphoric acid), tetramethylammonium hydroxide (TMAH), other suitable chemicals, or combinations thereof (e.g., a standard clean 1 (SC1) (i.e., mixture of $NH_4OH$, $H_2O_2$, and DIW), a standard clean 2 (SC2) (i.e., mixture of HCl, $H_2O_2$, and DIW), a sulfuric peroxide mix (SPM) (i.e., mixture of $H_2SO_4$ and $H_2O_2$), a sulfuric oxide mix (SOM) (i.e., mixture of $H_2SO_4$ and $O_3$), other mixtures, or combinations thereof). During a wet clean, device 100 and/or the wet cleaning solution may be agitated using ultrasonic energy or any other technique to facilitate the cleaning process. Likewise, during a wet clean and/or a dry clean, heat may be applied to promote cleaning.

In some embodiments, patterned mask layer 160 is removed before the cleaning process and after the etching of ILD layer 155, ILD layer 150, CESL, or combinations thereof (for example, by a resist stripping process or an etching process). In some embodiments, patterned mask layer 160 is removed by the cleaning process. In some embodiments, patterned mask layer 160 is at least partially removed during etching of ILD layer 155, ILD layer 150, CESL, or combinations thereof. In some embodiments, remainders of patterned mask layer 160, such as those after etching of ILD layer 155, ILD layer 150, CESL, or combinations thereof and/or after removal of patterned mask layer 160 are removed by the cleaning process.

Figures 5A, 5B, 5C:
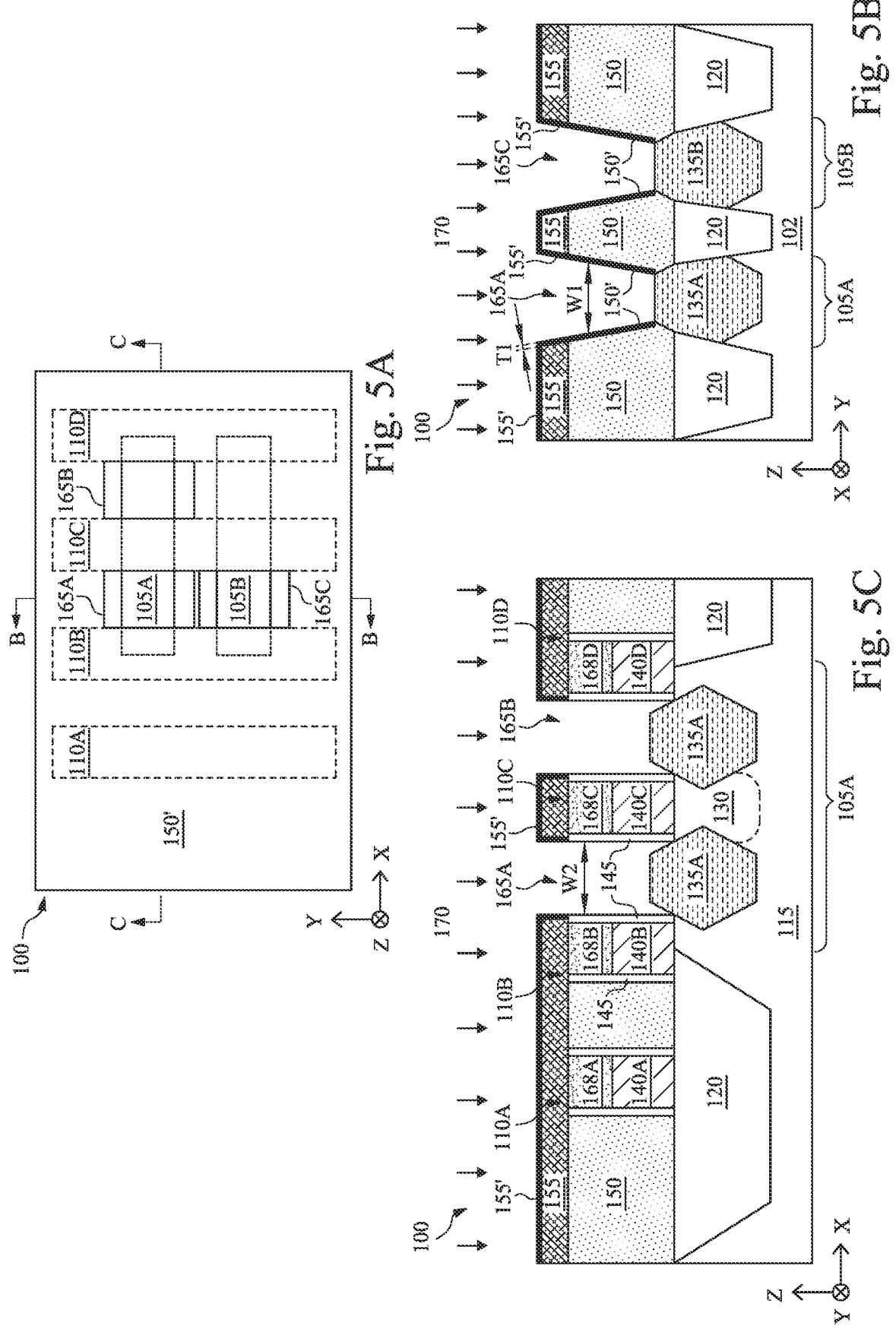

Turning to FIGS. 5A-5C, a nitrogen plasma treatment 170 is performed to convert exposed surfaces of ILD layer 150, such as those that form sidewalls of source/drain contact openings 165A-165C, into a nitrogen-containing crust 150'. In the depicted embodiment, where ILD layer 150 includes silicon and oxygen (e.g., $SiO_x$ or SiOC), nitrogen-containing crust 150' includes silicon, oxygen, and nitrogen (e.g., SiON or SiOCN). Nitrogen-containing crust 150' (i.e., treated portion) forms an outer shell of ILD layer 150 (i.e., untreated portion) that is resistant to metal penetration as described herein. For example, nitrogen-containing crust 150' prevents (or significantly hinders) penetration of metal constituents from subsequently-formed source/drain contacts and/or other interconnects into ILD layer 150. Nitrogen-containing crust 150' has a thickness T1. In some embodiments, thickness T1 is about 1 nm to about 5 nm. A nitrogen-containing crust having a thickness less than about 1 nm may not sufficiently block/prevent diffusion of metal constituents into ILD layer 150, such as described herein, and/or sufficiently resist fluorine-based attacks during subsequent processing, such as described herein. A nitrogen-containing crust having a thickness greater than about 5 nm can increase an overall dielectric constant of ILD layer 150 more than desired, which an undesirably increase capacitance and/or RC delay, and/or may necessitate longer exposure of device 100 to nitrogen plasma treatment 170, which can undesirably alter electrical and/or physical properties of device 100. Because nitrogen plasma treatment 170 converts a portion of ILD layer 150 into nitrogen-containing crust 150', nitrogen plasma treatment 170 does not change dimensions of source/drain contact openings 165A-165C. For example, source/drain contact openings 165A-165C have width W1 (FIG. 5B) and width W2 (FIG. 5C) after nitrogen plasma treatment 170. In some embodiments, nitrogen plasma treatment 170 also converts exposed surfaces of ILD layer 155 into a nitrogen-containing crust 155'. Nitrogen-containing crust 155' includes nitrogen in addition to constituents as ILD layer 155. For example, where ILD layer 155 includes silicon and oxygen (e.g., $SiO_x$ or SiOC), nitrogen-containing crust 155' includes silicon, oxygen, and nitrogen (e.g., SiON or SiOCN).

Nitrogen-containing crust 150' has a nitrogen concentration that is about 3 atomic percent (at %) to about 30 at %. A nitrogen-containing crust having a nitrogen concentration less than about 3 at % may not sufficiently block/prevent diffusion of metal constituents into ILD layer 150 and/or sufficiently resist fluorine-based attacks during subsequent processing. A nitrogen-containing crust having a nitrogen concentration greater than about 30 at % can increase an overall dielectric constant of ILD layer 150 more than desired, which can undesirably increase capacitance and/or RC delay, and/or may necessitate longer exposure of device 100 to nitrogen plasma treatment 170, which can undesirably alter electrical and/or physical properties of device 100. In some instances, a nitrogen-containing crust having a nitrogen concentration greater than about 30 at % can damage epitaxial source/drains 135A, 135B and/or alter characteristics of epitaxial source/drains 135A, 135B, for example, by nitridizing and/or oxidizing epitaxial source/drains. Such damage/alteration can induce high contact source/drain resistance.

In some embodiments, a nitrogen concentration of nitrogen-containing crust 150' is substantially uniform along thickness T1. For example, a nitrogen concentration is substantially the same from exposed surfaces of nitrogen-containing crust 150' (which form sidewalls of source/drain contact openings 165A-165C) to ILD layer 150 (i.e., interface between untreated portions and treated portions of ILD layer 150). In some embodiments, a nitrogen concentration of nitrogen-containing crust 150' has a graded profile, where a nitrogen concentration decreases (or increases) along thickness T1 from exposed surfaces of nitrogen-containing crust 150' (which form sidewalls of source/drain contact openings 165A-165C) to ILD layer 150. In some embodiments, nitrogen-containing crust 150' has other nitrogen concentration profiles, such as a stair profile, a linear continuous profile, a non-linear continuous profile, a bell-curved profile, a saw-tooth profile, or other suitable profile.

Nitrogen plasma treatment 170 is configured to drive a sufficient amount of nitrogen to a sufficient depth in ILD layer 150, such that nitrogen plasma treatment 170 provides ILD layer 150 with a nitrogen-containing crust that can adequately prevent metal penetration/diffusion from source/drain contacts into ILD layer 150 and/or a nitrogen-containing crust that is resistant to attacks from fluorine during subsequent fluorine-based metallization processes. In some embodiments, nitrogen plasma treatment 170 includes flowing a nitrogen-containing gas and a carrier gas into a process chamber, generating a nitrogen-containing plasma therefrom, and bombarding ILD layer 150 with plasma-excited nitrogen-containing species of the nitrogen-containing plasma. The nitrogen-containing gas can include $N_2$ (diatomic nitrogen), $NH_3$ (ammonia), $N_2O$ (nitrous oxide), other suitable nitrogen-containing precursor, or combinations thereof. The carrier gas may be an inert gas, such as an argon-containing gas, a helium-containing gas, a xenon-containing gas, other suitable gas, or combinations thereof. In some embodiments, nitrogen plasma treatment 170 further includes flowing a hydrogen-containing gas, such as $H_2$, and/or other suitable gas into the process chamber. In some embodiments, nitrogen plasma treatment 170 is an $N_2$ plasma treatment that generates the nitrogen-containing plasma from $N_2$. In such embodiments, the nitrogen-containing plasma can include nitrogen-containing excited neutral molecules (e.g., $N_2^*$), nitrogen-containing ionized molecules (e.g., $N_2+$), nitrogen-containing atoms (e.g., N), ionized atoms (N+), or combinations thereof (all generally referred to as plasma-excited nitrogen-containing species).

Parameters of nitrogen plasma treatment 170 are tuned to provide nitrogen-containing crust 150' with a target nitrogen atomic percentage (e.g., about 3 at % to about 30 at %), a target thickness (e.g., about 1 nm to about 5 nm), a target amount of nitrogen bonding, other target characteristic, or combinations thereof. The parameters can include a flow rate and/or a concentration of a nitrogen-containing precursor gas, a flow rate and/or a concentration of a carrier gas, a flow rate and/or a concentration of a hydrogen-containing precursor gas, a ratio of the flow rate of the nitrogen-containing precursor gas to the flow rate of the carrier gas and/or the flow rate of the hydrogen-containing precursor gas, a ratio of the concentration of the nitrogen-containing precursor gas to the concentration of the carrier gas and/or the concentration of the hydrogen-containing precursor gas, a power of a radio frequency (RF) source, a power of a direct current (DC) source, a bias voltage (for example, an RF bias voltage and/or a DC bias voltage for exciting the plasma and/or accelerating the plasma towards ILD layer 150), a tilt angle, a pressure, a duration, other suitable parameters, or combinations thereof. In some embodiments, an RF power used to generate the nitrogen-containing plasma is about 80 W to about 3,000 W. In some embodiments, a duration of nitrogen plasma treatment 170 is about 10 seconds to about 500 seconds. In some embodiments, nitrogen plasma treatment 170 is performed at a pressure of about 1 torr to about 20 torr and/or at a temperature of about 250° C. to about 550° C.

Figures 6A, 6B, 6C:
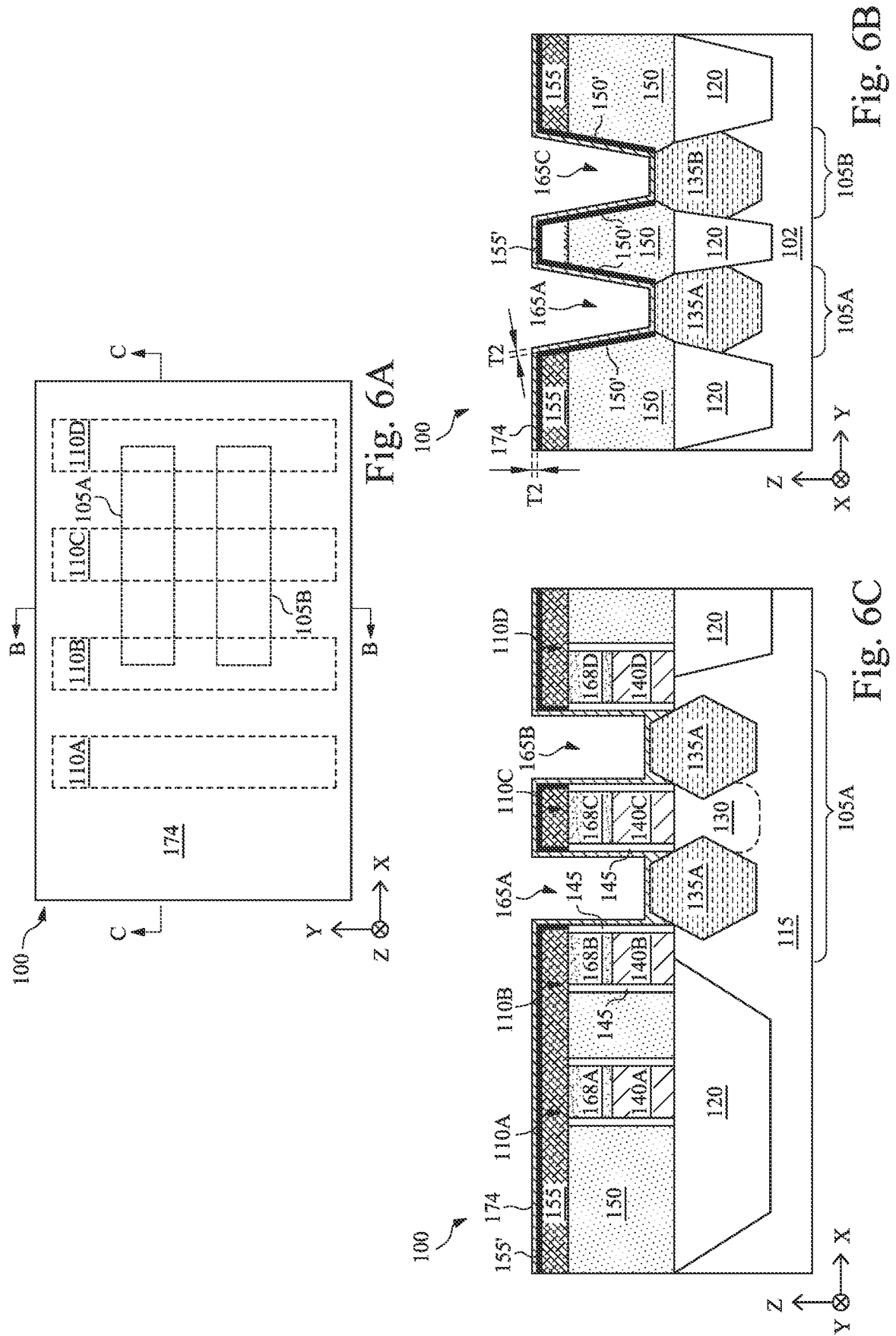

Turning to FIGS. 6A-6C, a dielectric contact liner 174 is deposited over ILD layer 155 and partially fills source/drain contact openings 165A-165C. Dielectric contact liner 174 is disposed on top surfaces of ILD layer 155 (in particular, nitrogen-containing crust 155' thereof), sidewalls of source/drain contact openings 165A-165C, and bottoms of source/drain contact openings 165A-165C. For example, dielectric contact liner 174 covers sidewalls of ILD layer 155 (in particular, nitrogen-containing crust 155' thereof), sidewalls of ILD layer 150 (in particular, nitrogen-containing crust 150' thereof), and gate spacers 145, which form sidewalls of source/drain contact openings 165A-165C. Dielectric contact liner 174 further covers epitaxial source/drains 135A, 135B, which form bottoms of source/drain contact openings 165A-165C. Dielectric contact liner 174 is deposited by CVD, PVD, ALD, HDPCVD, MOCVD, RPCVD, PECVD, LPCVD, ALCVD, APCVD, other deposition process, or combinations thereof. For example, dielectric contact liner 174 is conformally deposited by ALD, such that dielectric contact liner 174 has a thickness that is substantially uniform over surfaces of device 100.

Dielectric contact liner 174 includes a dielectric material that is different than a dielectric material of ILD layer 150 and that can hinder and/or prevent diffusion of metal constituents from subsequently formed source/drain contacts into ILD layer 150. The dielectric material may be a semiconductor oxide, a semiconductor nitride (e.g., SiN), a semiconductor carbide (e.g., SiC), a semiconductor oxynitride (e.g., SiON), a semiconductor oxycarbide (e.g., SiOC), semiconductor oxycarbonitride (e.g., SiOCN), a metal oxide (e.g., AlO), other suitable dielectric material, or combinations thereof. In the depicted embodiment, where ILD layer 150 includes silicon and oxygen (e.g., $SiO_x$ or SiOC), dielectric contact liner 174 includes silicon and nitrogen, such as a silicon nitride layer (e.g., SiN). In such embodiments, dielectric contact liner 174 has a nitrogen concentration that is greater than a nitrogen concentration of nitrogen-containing crust 150'. In some embodiments, dielectric contact liner 174 has a nitrogen concentration that is about 40 at % to about 60 at %. Dielectric contact liner 174 has a thickness T2. In some embodiments, thickness T2 is about 2 nm to about 4 nm.

Figures 7A, 7B, 7C:
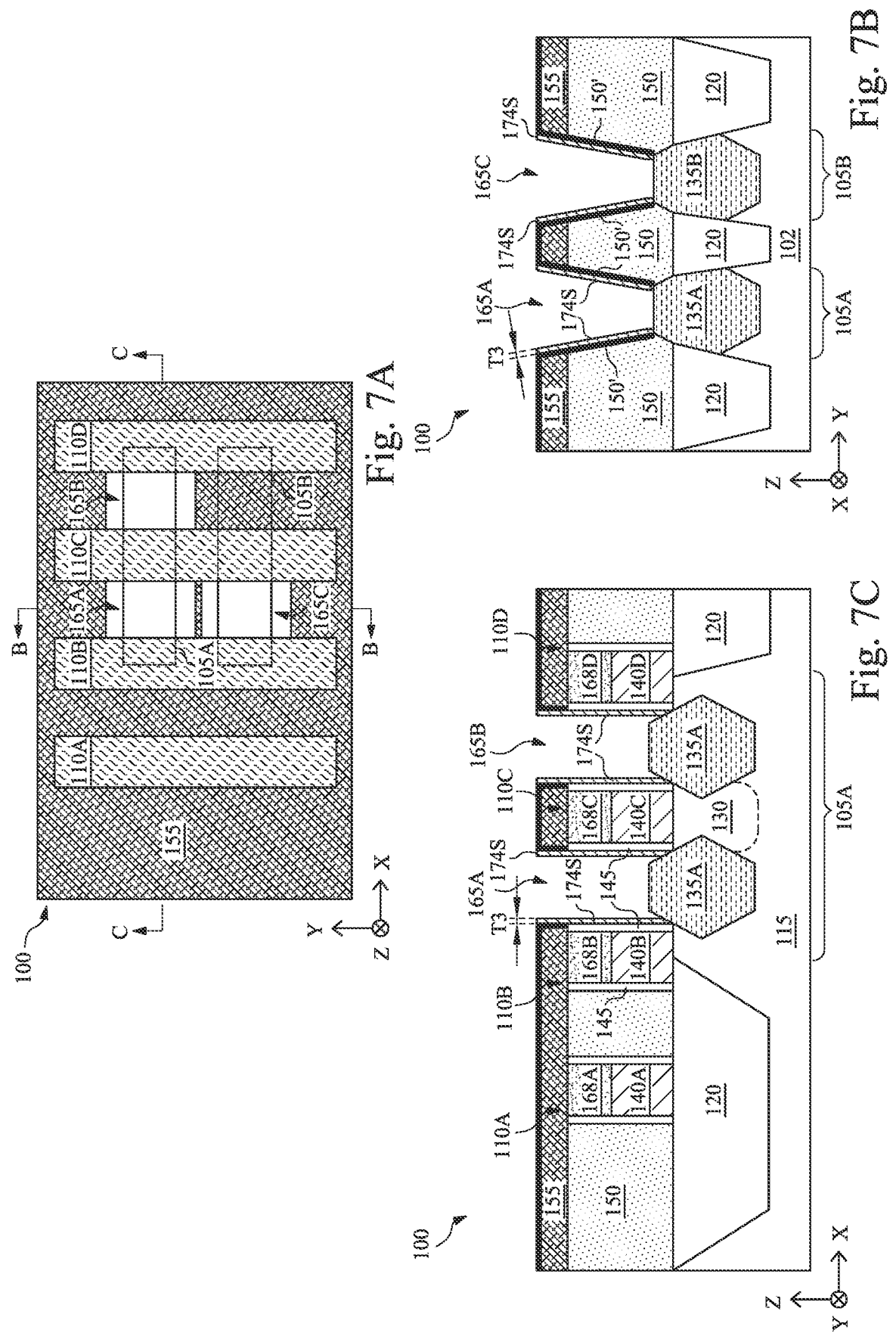

In FIGS. 7A-7C, portions of dielectric contact liner 174 are removed by an etching process, such as a dry etch, a wet etch, other suitable etching process, or combinations thereof. Remaining portions of dielectric contact liner 174 form contact spacers 174S, which cover sidewalls of source/drain contact openings 165A-165C. Accordingly, after the etching process, source/drain contact openings 165A-165C have sidewalls formed by contact spacers 174S and bottoms formed by epitaxial source/drains 135A, 135B. Contact spacers 174S extend lengthwise along the z-direction and have a thickness T3 (here, along the y-direction and the x-direction). In the depicted embodiment, thickness T3 is about equal to thickness T2. In some embodiments, the etching process slightly etches dielectric contact liner 174 along the x-direction and/or the y-direction, such that thickness T3 is less than thickness T2. In some embodiments, thickness T3 is substantially uniform along its length. For example, thickness T3 is substantially the same from tops to bottoms of source/drain contact openings 165A-165B. In some embodiments, thickness T3 tapers along its length. For example, thickness T3 may decrease or increase from tops to bottoms of source/drain contact openings 165A-165B.

The etching process may be configured to selectively etch dielectric contact liner 174 without (or minimally) etching ILD layer 155 and/or ILD layer 150. For example, where dielectric contact liner 174 are silicon nitride layers (e.g., SiN or SiON) and ILD layer 155 and/or ILD layer 150 are oxide layers (e.g., $SiO_x$ or SiOC), an etching chemistry can be tuned to selectively etch silicon nitride without (or minimally) etching silicon oxide and semiconductor materials. In such embodiments, the etching process may remove nitrogen-containing crust 155', in portion or entirety, from tops of ILD layer 155. In some embodiments, the etching process is an anisotropic etch process, which generally refers to an etch process having different etch rates in different directions, such that the etch process removes material in specific directions. For example, the etching has a vertical etch rate that is greater than a horizontal etch rate (in some embodiments, the horizontal etch rate equals zero). The anisotropic etch process thus removes material in substantially the vertical direction (here, z-direction) with minimal (to no) material removal in the horizontal direction (here, x-direction and/or y-direction). In such embodiments, the anisotropic etch removes portions of dielectric contact liner 174 on horizontally-oriented surfaces of device 100 (i.e., from top surfaces of ILD layer 155 and top surfaces of epitaxial source/drains 135A, 135B) but does not remove, or minimally removes, portions of dielectric contact liner 174 on vertically-oriented surfaces (i.e., sidewalls of ILD layer 155, sidewalls of ILD layer 150, and sidewalls of gate spacers 145).

In some embodiments, an implantation process is performed to introduce dopants into epitaxial source/drains 135A and/or epitaxial source/drains 135B before etching dielectric contact liner 174. The implantation process can increase a dopant concentration at and/or near surfaces of epitaxial source/drains 135A and/or epitaxial source/drains 135B that will physically contact subsequently formed source/drain contacts, which can reduce source/drain contact resistance, thereby improving performance of device 100. In some embodiments, the implantation process may form doped regions along tops of epitaxial source/drains 135A, 135B that have a dopant concentration that is greater than a dopant concentration of portions of epitaxial source/drains 135A, 135B thereunder. The implantation process can introduce boron, phosphorous, arsenic, other suitable dopant, or combinations thereof into epitaxial source/drains 135A and/or epitaxial source/drains 135B. In some embodiments, the implantation process is a plasma-based doping process that generates a plasma from a dopant gas (including, for example, $B_2H_6$, $BF_3$, $AsH_3$, $PH_3$, other suitable dopant gas precursor, or combinations thereof) and a dilution gas precursor (including, for example, Ar, He, Ne, $H_2$, $O_2$, $N_2$, other suitable dilution gas precursor, or combinations thereof). Annealing processes can be performed to activate the dopants introduced into epitaxial source/drains 135A and/or epitaxial source/drains 135B by the implantation process. The present disclosure further contemplates embodiments where the implantation process is performed after etching dielectric contact liner 174.

Turning to FIGS. 8A-8C and FIGS. 9A-9C, source/drain contacts 180A-180C are formed in remainders of source/drain contact openings 165A-165C. Source/drain contact 180A includes a respective silicide layer 176A and a respective metal plug 178A, source/drain contact 180B includes a respective silicide layer 176A and a respective metal plug 178B, and source/drain contact 180C includes a respective silicide layer 176B and a respective metal plug 178C. Metal plugs 178A-178C are separated from nitrogen-containing crust 150' of ILD layer 150 by contact spacers 174S. Metal plugs 178A-178C are separated from untreated portions of ILD layer 150 by nitrogen-containing crust 150' (i.e., treated portions of ILD layer 150) and contact spacers 174S. In some embodiments, metal plugs 178A-178C include metal bulk layers and metal liner(s), where the metal liner(s) are between the metal bulk layers and contact spacers 174S. In some embodiments, the metal liner(s) are between the metal bulk layers and silicide layers 176A, 176B. In some embodiments, metal plugs 178A-178C do not have metal liner(s) (also referred to as metal barrier layer(s)) between their metal bulk layers and their surrounding dielectric material (here, ILD layer 150 and contact spacers 174S). In such embodiments, sidewalls of the metal bulk layers of metal plugs 178A-178C directly, physically contact a dielectric layer, provided by contact spacers 174S in the depicted embodiment, and source/drain contacts 180A-180C can be referred to as metal barrier/liner-free contacts.

Figures 8A, 8B, 8C:
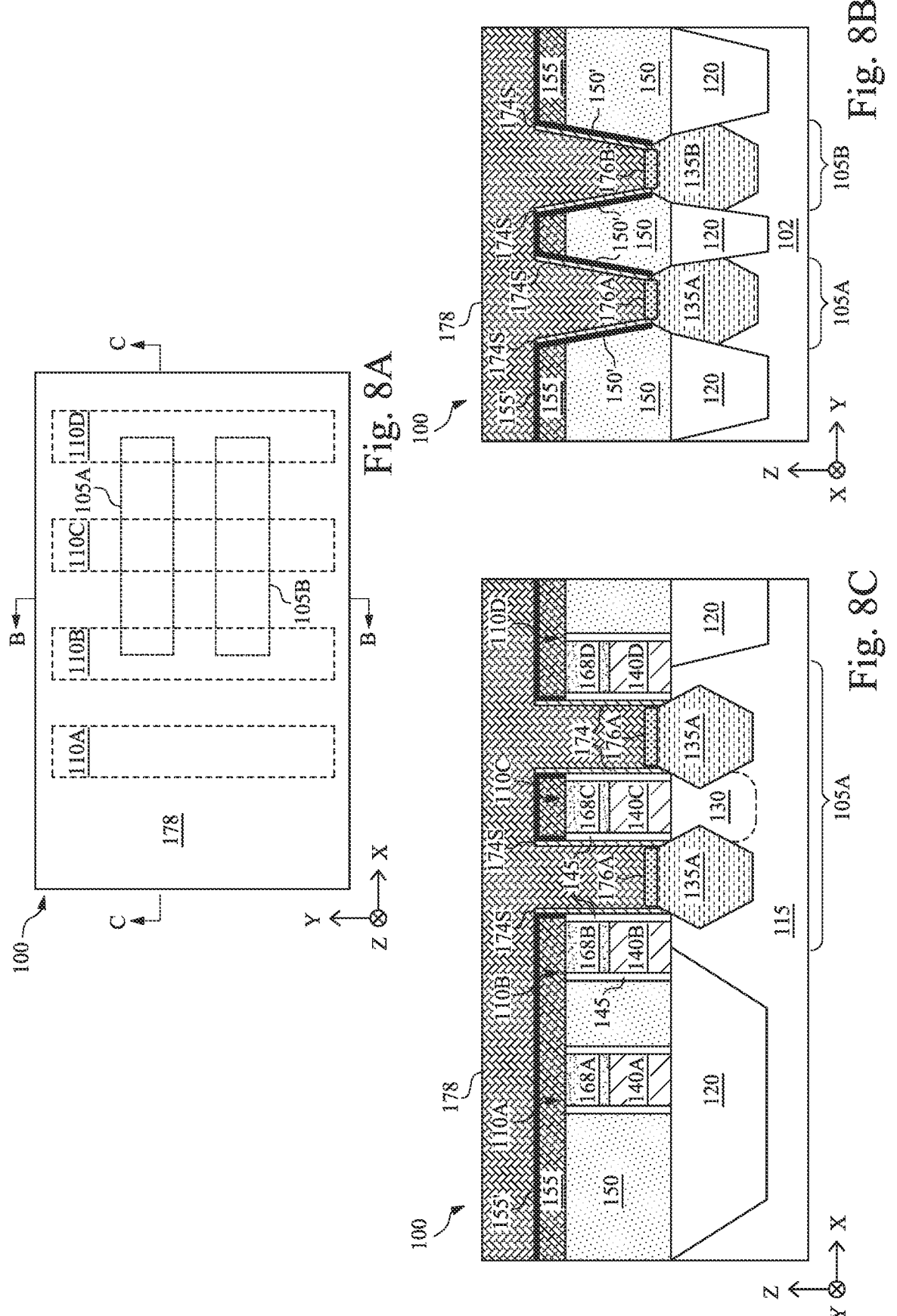

In FIGS. 8A-8C, silicide layers 176A and silicide layers 176B are formed over epitaxial source/drains 135A and epitaxial source/drains 135B, respectively. Silicide layers 176A, 176B can be formed by depositing a metal layer over epitaxial source/drains 135A, 135B and heating device 100, such as by an annealing process, to cause constituents of epitaxial source/drains 135A, 135B (e.g., silicon and/or germanium) to react with metal constituents in the metal layer. The metal layer includes any metal constituent suitable for promoting silicide formation, such as nickel, platinum, palladium, vanadium, titanium, cobalt, tantalum, ytterbium, zirconium, other suitable metal, or combinations thereof. Silicide layers 176A, 176B thus include a metal constituent and a constituent of epitaxial source/drains 135A, 135B (e.g., silicon and/or germanium). In some embodiments, the metal layer is a titanium-containing layer, a cobalt-containing layer, or a nickel-containing layer, and silicide layers 176A, 176B include titanium, cobalt, or nickel, and silicon and/or germanium. In such embodiments, silicide layers 176A, 176B may be titanium silicide layers, nickel silicide layers, or cobalt silicide layers. In some embodiments, portions of the epitaxial source/drains 135A and/or portions of epitaxial source/drains 135B are converted into silicide layers 176A and silicide layers 176B, respectively, during the silicidation process. Any un-reacted metal, such as remaining portions of the metal layer, is selectively removed by a suitable process, such as an etching process.

After forming silicide layers 176A, 176B, a contact plug material 178 is formed over ILD layer 155, contact spacers 174S, and silicide layers 176A, 176B. Contact plug material 178 fills remainders of source/drain contact openings 165A-165C. Contact plug material 178 includes tungsten, ruthenium, cobalt, molybdenum, copper, aluminum, titanium, tantalum, iridium, palladium, platinum, nickel, tin, gold, silver, other suitable metal, alloys thereof, or combinations thereof. In the depicted embodiment, forming contact plug material 178 includes depositing a metal bulk material, such as tungsten, cobalt, or ruthenium. In such embodiments, the metal bulk layers of metal plugs 178A-178C are tungsten plugs, cobalt plugs, or ruthenium plugs. The metal bulk material is formed by a blanket deposition process, such as blanket CVD. For example, the metal bulk material is blanket deposited over ILD layer 155 and fills source/drain contact openings 165A-165C. The blanket deposition process can include flowing a metal-containing precursor (e.g., a tungsten-containing precursor, such as $WF_6$ or $WCl_5$) and a reactant precursor (e.g., $H_2$, other suitable reactant gas, or combinations thereof) into a process chamber. In some embodiments, a carrier gas is used to deliver the metal-containing precursor gas and/or the reactant gas to the process chamber. The carrier gas may be an inert gas, such as an argon-containing gas, a helium-containing gas, a xenon-containing gas, other suitable inert gas, or combinations thereof. In some embodiments, the blanket deposition process is PVD, ALD, electroplating, electroless plating, other suitable process, or combinations thereof.

In some embodiments, the metal bulk material is formed by a bottom-up deposition process, which generally refers to a deposition process that fills source/drain contact openings 165A-165C from bottom to top. The blanket deposition process, such as selective CVD or selective ALD, can include flowing a metal-containing precursor (e.g., a tungsten-containing precursor, such as $WF_6$ or $WCl_5$), a reactant precursor (e.g., $H_2$, other suitable reactant gas, or combinations thereof), and a carrier gas into a process chamber and tuning deposition parameters to selectively grow the metal bulk material from silicide layers 176A, 176B (or metal seed layers and/or metal liner(s) formed over silicide layers 176A, 176B) while limiting (or preventing) growth of the metal bulk material from ILD layer 155 and contact spacers 174S. The deposition parameters can include deposition precursors (for example, metal precursors and/or reactants), deposition precursor flow rates, deposition temperature, deposition time, deposition pressure, source power, RF bias voltage, RF bias power, other suitable deposition parameters, or combinations thereof. In some embodiments, the bottom-up deposition process includes multiple deposition/etch cycles, each of which can include depositing a conductive material (e.g., tungsten, ruthenium, or cobalt) and etching back the conductive material successively.

In embodiments where metal plugs 178A-178C include metal liner(s), forming contact plug material 178 includes depositing a barrier/liner material over ILD layer 155, contact spacers 174S, and silicide layers 176A, 176B before forming the metal bulk material. The barrier/liner material partially fills and lines source/drain contact openings 165A-165C. The barrier/liner material can promote adhesion between contact spacers 174S and the metal bulk layers of metal plugs 178A-178C and/or prevent diffusion of metal constituents from the metal bulk layers into ILD layer 150 and/or contact spacers 174S. For example, the barrier/liner material includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof.

Figures 9A, 9B, 9C:
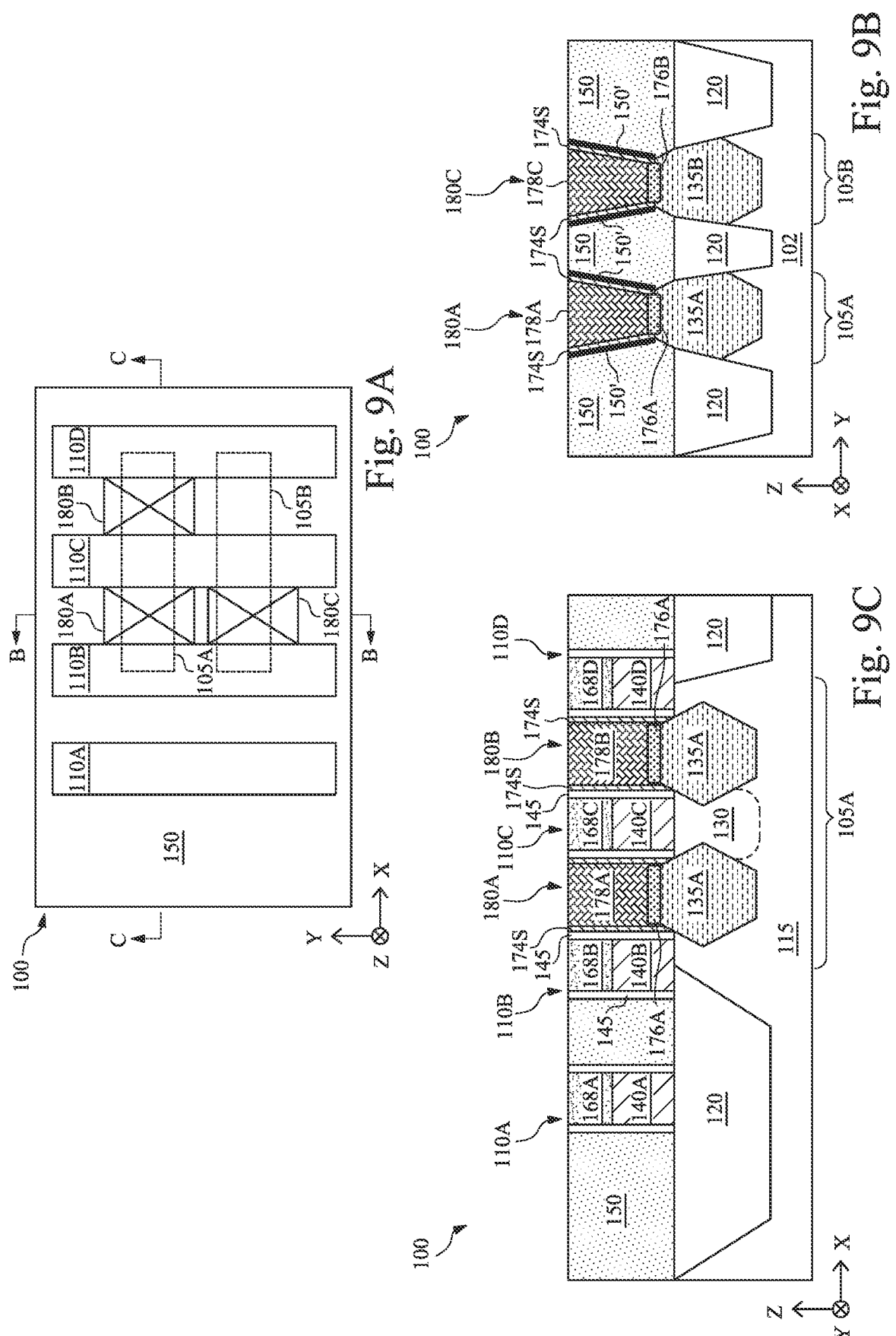

In FIGS. 9A-9C, a CMP process and/or other planarization process is performed on conductive plug material 178. The CMP process is performed until reaching and exposing ILD layer 150. In such embodiments, the CMP process removes ILD layer 155 (and nitrogen-containing crust 155' thereof), excess conductive plug material 178, such as that extending above and/or over top surface of ILD layer 150, and portions of contact spacers 174S that extend above and/or over top surface of ILD layer 150. Remainders of conductive plug material 178 form metal plugs 178A-178C of source/drain contacts 180A-180C, respectively. In some embodiments, the CMP process removes excess barrier/liner material, such as that extending above and/or over top surface of ILD layer 150, and remainders of the barrier/liner material form metal liners of source/drain contacts 180A-180B. In some embodiments, ILD layer 150, SAC features 168A-168D, gate spacers 145, contact spacers 174S, or combinations thereof function as a CMP stop layer. In some embodiments, the CMP process is performed for a time sufficient to remove ILD layer 155 from over ILD layer 150 and/or reach SAC features 168A-168D. The CMP process can planarize a top surface of ILD layer 150 (including top surfaces of nitrogen-containing crust 150' thereof), top surfaces of SAC features 168A-168D, top surfaces of gate spacers 145, top surfaces of contact spacers 174S, and top surfaces of metal plugs 178A-178C. Such surfaces may form a substantially planar surface after the CMP process.

Turning to FIGS. 10A-10C and FIGS. 11A-11C, a CESL 182 is formed over ILD layer 150, and an ILD layer 184 is formed over CESL 182. ILD layer 184 is similar to ILD layer 150 and/or ILD layer 155 and thus includes a dielectric material, such as those described herein. For example, ILD layer 184 includes silicon and oxygen (e.g., $SiO_x$ or SiOC). CESL 182 includes a material that is different than ILD layer 184 to achieve etch selectivity during subsequent etching processes. CESL 182 can be referred to as a middle CESL (MCESL). In embodiments where ILD layer 184 is an $SiO_x$ layer, CESL 182 can include silicon and nitrogen and/or carbon. For example, CESL 182 may be an SiN layer, an SiON layer, an SiC layer, an SiOC layer, or an SiOCN layer. In embodiments where ILD layer 184 is an SiOC layer, CESL 182 can include silicon and nitrogen. For example, CESL 182 may be an SiN layer or an SiON layer. In some embodiments, CESL 182 includes metal and oxygen and/or nitrogen, such as aluminum oxide, aluminum nitride, aluminum oxynitride, zirconium oxide, zirconium nitride, hafnium oxide, zirconium aluminum oxide, other metal oxide, other metal nitride or combinations thereof. For example, CESL 182 may be an $AlO_y$ layer, where y is a number of oxygen atoms. CESL 182 and ILD layer 184 are formed by CVD, PVD, ALD, HDPCVD, HARP, FCVD, MOCVD, RPCVD, PECVD, LPCVD, ALCVD, APCVD, other suitable methods, or combinations thereof. In some embodiments, CESL 182 and/or ILD layer 184 are formed by CVD, PECVD, LPCVD, or HDPCVD. A CMP process and/or other planarization process may be performed after deposition of CESL 182 and/or ILD layer 184.

Figures 10A, 10B, 10C:
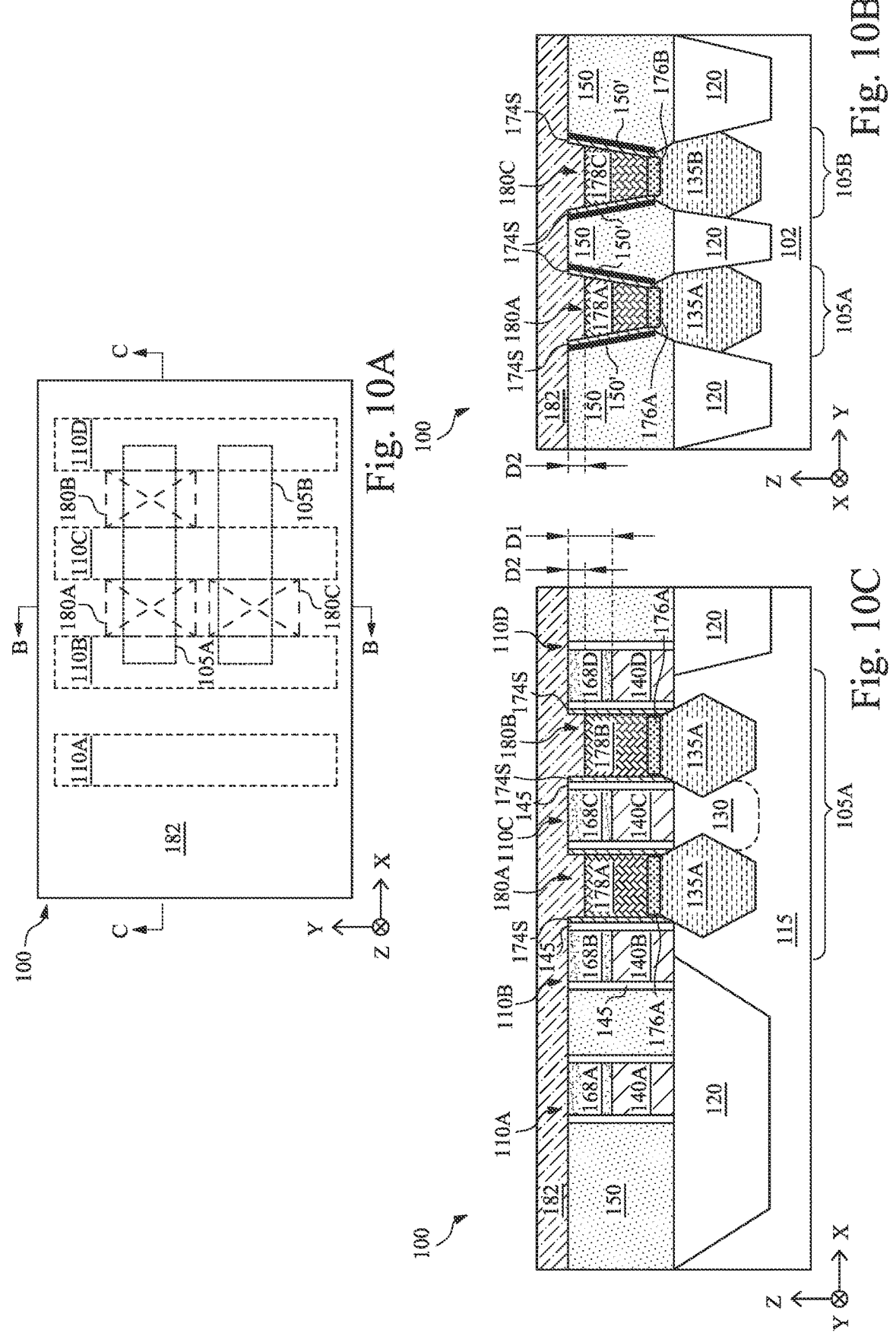
Figures 11A, 11B, 11C:
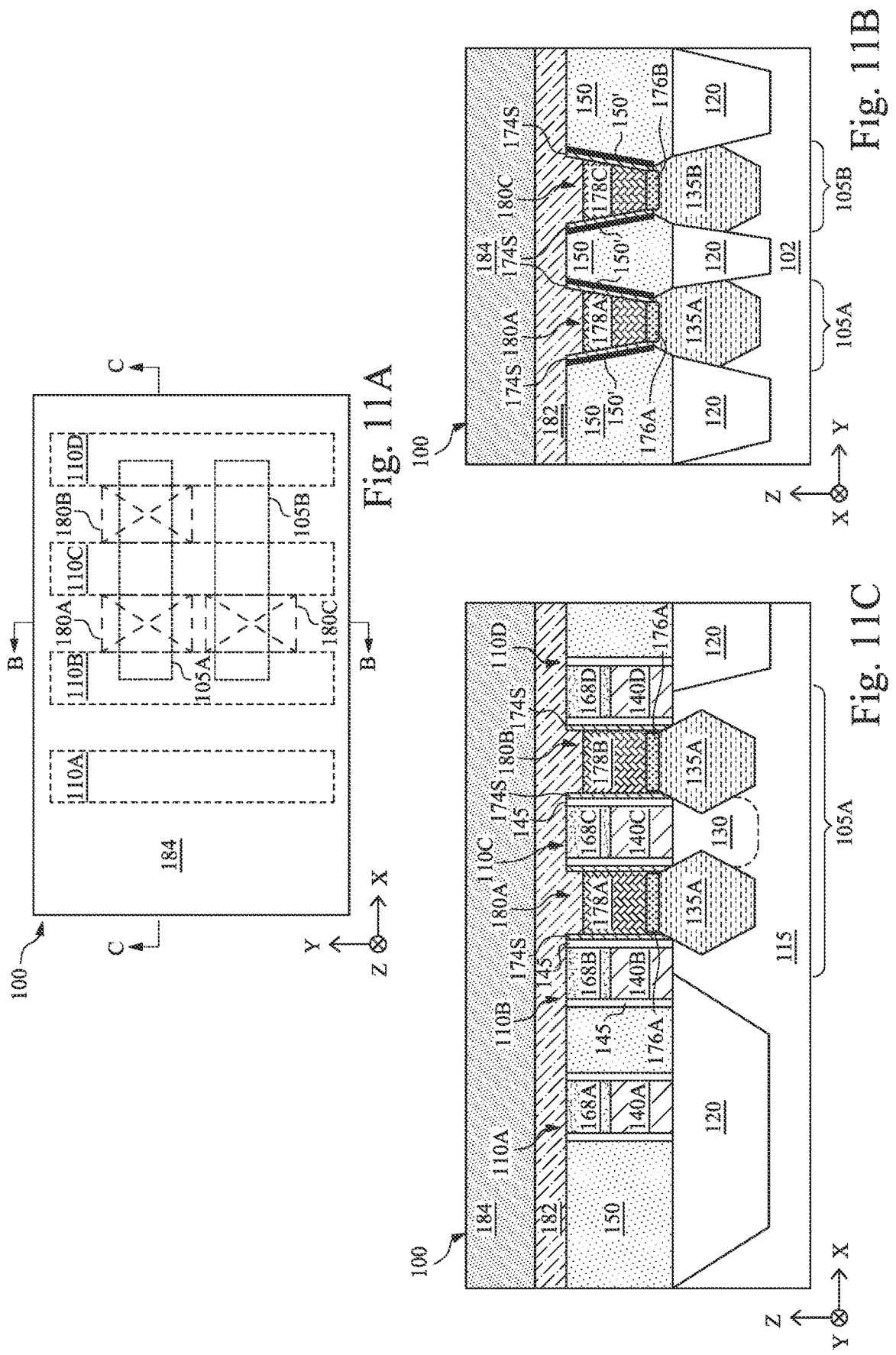

In some embodiments, metal plugs 178A-178C may shrink (for example, as a result of grain size changes) during fabrication of CESL 182 and/or fabrication of ILD layer 184, such that top surfaces of metal plugs 178A-178C are lower than top surface of ILD layer 150 as depicted in FIG. 10B and FIG. 10C. In such embodiments, a distance D2 is between top surfaces of metal plugs 178A-178C and top surface of ILD layer 150, and portions of CESL 182 extend below top surface of ILD layer 150 to top surfaces of metal plugs 178A-178C. The portions of CESL 182 are further between respective contact spacers 174S. In the depicted embodiment, distance D2 is less than distance D1. In some embodiments, distance D2 is about 3 nm to about 5 nm. In some embodiments, distance D2 is equal to distance D1.

Figures 12A, 12B, 12C:
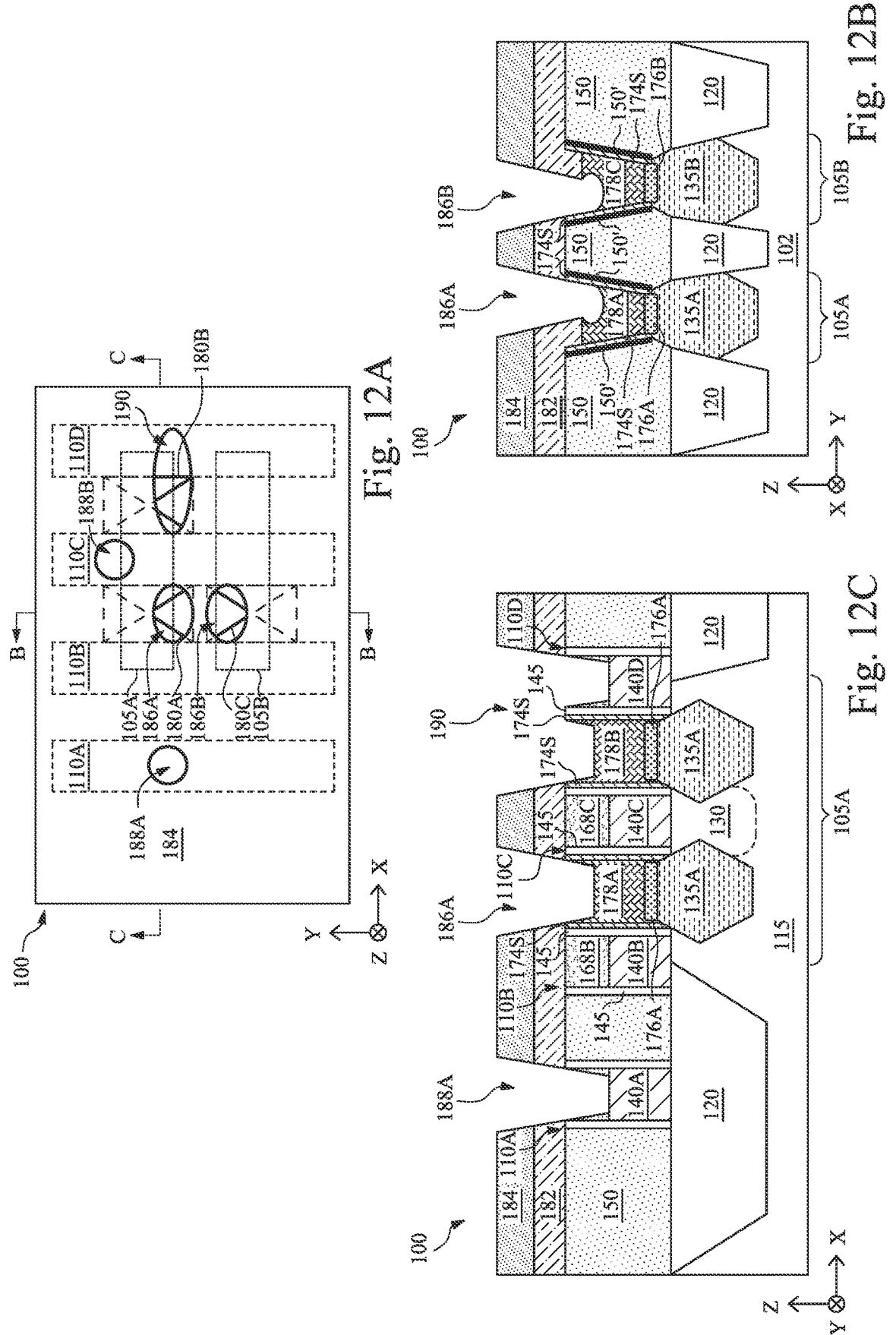

Turning to FIGS. 12A-12C, a patterning process is performed to form source/drain via openings, gate via openings, and butted contact openings in ILD layer 184 and CESL 182. For example, a source/drain via opening 186A extends through ILD layer 184 and CESL 182 to expose source/drain contact 180A, a source/drain via opening 186B extends through ILD layer 184 and CESL 182 to expose source/drain contact 180C, a gate via opening 188A extends through ILD layer 184, CESL 182, and SAC feature 168A to expose gate stack 140A, a gate via opening 188B extends through ILD layer 184, CESL 182, and SAC feature 168C to expose gate stack 140C, and a butted contact opening 190 extends through ILD layer 184, CESL 182, and SAC feature 168D to expose gate stack 140D and source/drain contact 180B.

Source/drain via opening 186A and source/drain via opening 186B have upper portions (above metal plugs 178A-178C) and lower portions (extending into metal plugs 178A-178C). The upper portions are connected to the lower portions, the upper portions have sidewalls formed by ILD layer 184 and CESL 182, the lower portions have sidewalls formed by respective metal plugs 178A-178C and/or respective contact spacers 174S, and the lower portions have bottoms formed by respective metal plugs 178A-178C. The upper portions have trapezoidal shapes in the y-z plane and the x-z plane, though the present disclosure contemplates the upper portions have other shapes, such as rectangular shapes. In such embodiments, sidewalls of ILD layer 184 and CESL 182 are tapered, and widths of the upper portions decrease along the z-direction from top to bottom. In the depicted embodiment, the upper portions extend below top surface of ILD layer 150 (for example, by distance D2) in the y-z plane (FIG. 12B) and to top surface of ILD layer 150 in the x-z plane (FIG. 12C), and the lower portions extend a distance below top surface of ILD layer 150 that is greater than distance D2 and less than distance D1. The lower portions have semi-circle shapes in the y-z plane and trapezoidal shapes in the x-z plane, though the present disclosure contemplates the lower portions having other shapes. In such embodiments, in the x-z plane, sidewalls of metal plugs 178A-178C and/or contact spacers 174S are tapered, and widths of the lower portions decrease along the z-direction from top to bottom, and in the y-z plane, sidewalls of metal plugs 178A-178C and/or contact spacers 174S are curved, and widths of the lower portions vary along the z-direction from top to bottom. For example, in the y-z plane, widths of the lower portions increase along the z-direction from top to bottom. In another example, in the y-z plane, widths of the lower portions increase from a first width at tops thereof to a maximum width and then decrease from the maximum width to a second width at bottoms thereof.

Gate via opening 188A has a bottom formed by gate stack 140A and sidewalls formed by ILD layer 184, CESL 182, and SAC feature 168A. Gate via opening 188B has a bottom formed by gate stack 140C and sidewalls formed by ILD layer 184, CESL 182, and SAC feature 168C. In some embodiments, sidewalls of gate via opening 188A and/or gate via opening 188B are further formed by gate spacers 145. Gate via opening 188A and gate via opening 188B have trapezoidal shapes (FIG. 12C), though the present disclosure contemplates gate via opening 188A and gate via opening 188B having other shapes, such as rectangular shapes. In such embodiments, for gate via opening 188A, sidewalls of ILD layer 184, CESL 182, SAC feature 168A, and gate spacers 145 are tapered, and a width of gate via opening 188A decreases along the z-direction from top to bottom. Similarly, for gate via opening 188B, sidewalls of ILD layer 184, CESL 182, SAC feature 168C, and gate spacers 145 are tapered, and a width of gate via opening 188B decreases along the z-direction from top to bottom.

Butted contact opening 190 has an upper portion (above ILD layer 150), a first lower portion (below ILD layer 150), and a second lower portion (below ILD layer 150). The upper portion is connected to the first lower portion and the second lower portion. The upper portion has sidewalls formed by ILD layer 184 and CESL 182. The upper portion has a trapezoidal shape in the y-z plane (FIG. 12C), though the present disclosure contemplates the upper portion having other shapes, such as a rectangular shape. In such embodiments, sidewalls of ILD layer 184 and CESL 182 are tapered, and a width of the upper portion decreases along the z-direction from top to bottom. The first lower portion has a bottom formed by metal plug 178B and sidewalls formed by metal plug 178B and/or contact spacers 174S. The second lower portion has a bottom formed by gate stack 140D and sidewalls formed by SAC feature 168D and/or gate spacers 145. The first lower portion and the second lower portion have trapezoidal shapes in the y-z plane (FIG. 12C), though the present disclosure contemplates the first lower portion and/or the second lower portion having other shapes, such as rectangular shapes. In such embodiments, sidewalls of metal plug 178B, contact spacers 174S, SAC feature 168D, gate spacers 145, or combinations thereof are tapered, and widths of the first lower portion and the second lower portion decrease along the z-direction from top to bottom. In the depicted embodiment, the second lower portion extends further below ILD layer 150 than the first lower portion. For example, the second lower portion extends about distance D1 below ILD layer 150, and the first lower portion extends a distance that is greater than distance D2 and less than distance D1.

The patterning process can include performing a lithography process, such as described herein, to form a patterned mask layer over ILD layer 184 having openings therein that define locations and/or dimensions of source/drain vias, gate vias, and/or butted contacts to be formed in ILD layer 184 and CESL 182 and performing an etching process to transfer a pattern defined in the patterned mask layer to ILD layer 184 and CESL 182. In some embodiments, the patterned mask layer is a patterned resist layer formed during the lithography process, and the patterned resist layer is used as an etch mask to remove portions of ILD layer 184 and CESL 182 exposed by openings in the patterned resist layer. In some embodiments, a mask layer is formed over ILD layer 184 before forming and patterning a resist layer, the patterned resist layer is used as an etch mask to remove portions of the mask layer and provide the patterned mask layer, and the patterned mask layer is used as an etch mask to remove portions of ILD layer 184 and CESL 182 exposed by openings in the patterned mask layer. In some embodiments, after the etching process, the patterned mask layer is removed from ILD layer 184. In some embodiments, the patterned mask layer 308 is removed during etching of ILD layer 184 and/or CESL 182.

The etching process removes portions of ILD layer 184 and/or CESL 182 exposed by openings in the patterned mask layer. The etching process may further remove portions of SAC features 168A-168E exposed by openings in the patterned mask layer. The etching process includes a dry etch, a wet etch, other etch process, or combinations thereof. In some embodiments, the etching process is a dry etch, such as an RIE, that uses a fluorine-containing etch gas to remove ILD layer 184 (e.g., a dielectric material that includes silicon and oxygen), CESL 182 (e.g., a dielectric material that includes silicon and nitrogen) at a higher rate than the patterned mask layer and/or metal plugs 178A-178C (e.g., metal-comprising material) (i.e., the etchant has a high etch selectivity with respect to ILD layer 184 and CESL 182). In some embodiments, the dry etch is configured to generate a fluorine-containing plasma from the fluorine-containing etch gas, such that the dry etch removes ILD layer 184 and CESL 182 using plasma-excited fluorine-containing species. The fluorine-containing etch gas includes fluorine ($F_2$), fluoromethane (e.g., $CH_3F$), difluoromethane (e.g., $CH_2F_2$), trifluoromethane (e.g., $CHF_3$), tetrafluoromethane (e.g., $CF_4$), hexafluoroethane (e.g., $C_2F_6$), sulfur hexafluoride (e.g., $SF_6$), nitrogen trifluoride (e.g., $NF_3$), other fluorine-containing etchant, or combinations thereof. In some embodiments, the dry etch utilizes an etch gas that includes $CF_4$ alone or in combination with $O_2$, $N_2$, $H_2$, or combinations thereof. A flow rate of $CF_4$, a flow rate of 02, a flow rate of $N_2$, a flow rate of $H_2$, a ratio of a flow rate and/or a concentration of $CF_4$ to $O_2$, $N_2$, $H_2$, or combinations thereof, an etch time, an etch temperature, an etch pressure, an RF power, or combinations hereof may be tuned to achieve desired etch selectivity. The dry etch can, alternatively or additionally, use a hydrogen-containing etch gas (for example, $H_2$ and/or $CH_4$), a nitrogen-containing etch gas (for example, $N_2$ and/or $NH_3$), a chlorine-containing etch gas (for example, $Cl_2$, $CHCl_3$, $CCl_4$, and/or $BCl_3$), an oxygen-containing etch gas (for example, $O_2$), a bromine-containing etch gas (for example, HBr and/or $CHBr_3$), an iodine-containing etch gas, other etch gas, or combinations thereof. In some embodiments, a carrier gas, such as those described herein, is used to deliver the fluorine-containing etch gas and/or other etch gas.

In some embodiments, the etching process is a multistep etch process that includes a first etch step that selectively etches ILD 184 and a second etch step that selectively etches CESL 182. For example, the first etch step is configured to remove ILD layer 184 but not remove or substantially remove CESL 182 so that the first etch stops upon reaching CESL 182, while the second etch step is configured to remove CESL 182 but not remove or substantially remove ILD 184 and metal plugs 178A-178C so that the second etch stops upon reaching metal plugs 178A-178C. In some embodiments, the second etch step may further remove SAC features 168A-168D but not remove gate stacks 140A-140D, such that the second etch step also stops upon reaching gate stacks 140A-140D. In some embodiments, the multistep etch process can further include a third etch step configured to remove SAC features 168A-168D but not remove or substantially remove ILD 184, CESL 182, metal plugs 178A-178C, gate stacks 140A-140D, or combinations thereof so that the third etch stops upon reaching gate stacks 140A-140D. Various etch parameters can be tuned to achieve selective etching of ILD layer 184 and CESL 182. For example, for the first etch step, an etchant is selected that etches ILD layer 184 at a higher rate than CESL 182 (i.e., the etchant has a high etch selectivity with respect to ILD layer 184). For the second etch step, an etchant is selected that etches CESL 182 at a higher rate than the ILD layer 184 (i.e., the etchant has a high etch selectivity with respect to CESL 182). In some embodiments, the first etch step etch and the second etch step can use the same etchant (e.g., the fluorine-containing etch gas) but different flow rates and/or concentrations of constituents of the etchant. In some embodiments, the first etch step and/or the second etch step may be configured to slightly over etch. For example, the first etch step may partially etch CESL 182 and/or the second etch step may partially etch SAC features 168A-168D and/or source/drain contacts 180A-180D. In embodiments where CESL 182 includes multiple layers, the second etch step may include multiple steps for selectively etching each layer of CESL 182, where each step is configured to selectively etch a respective one of the layers of CESL 182.

In some embodiments, such as depicted, an etching process is performed to recess source/drain contacts 180A-180C. Such process can be referred to as a contact etch back, a contact recess, and/or a plug recess (or etch back). The etching process includes a dry etch, a wet etch, other etch process, or combinations thereof. In some embodiments, the contact etch back is a wet etch that utilizes a wet etchant solution for removing metal material (i.e., metal plugs 178A-178C) at a higher rate than dielectric materials (i.e., ILD layer 184, CESL 182, contact spacers 174S, SAC features 168A-168D, gate spacers 145, or combinations thereof) (i.e., the etchant has a high etch selectivity with respect to metal plugs 178A-178C). For example, the wet etching process implements a wet etchant solution that includes HF, $HNO_3$, HCl, $NH_4OH$, $H_2O_2$, DIW, other suitable wet etchant solution constituents, or combinations thereof. A pH of the wet etchant solution, an etch temperature, an etch time, other wet etch parameter, or combinations thereof may be tuned to achieve desired etch selectively. The contact etch back can increases a contact area between source/drain contacts 180A-180C and subsequently formed vias, which can improve performance of device 100 and/or improve structural integrity of the vias. In some embodiments, to protect gate stacks 140A-140D from the contact etch back, the contact etch back is performed after etching ILD layer 184 and CESL 182 but before etching SAC features 168A-168D. In such embodiments, SAC features 168A-168D are etched/removed to expose gate stacks 140A-140D after the contact etch back. In some embodiments, the contact etch back uses the patterned mask layer as an etch mask.

Turning to FIGS. 13A-13C, source/drain vias, gate vias, and butted contacts are formed in the source/drain via openings, the gate via openings, and the butted contact openings, respectively. For example, a source/drain via 192A is formed in source/drain via opening 186A, a source/drain via 192B is formed in source/drain via opening 186B, a gate via 194A is formed in gate via opening 188A, a gate via 194B is formed in gate via opening 188B, and a butted contact/via 196 is formed in butted contact opening 190. Source/drain via 192A physically contacts source/drain contact 180A (in particular, metal plug 178A), source/drain via 192B physically contacts source/drain contact 180C (in particular, metal plug 178C), gate via 194A physically contacts gate stack 140A, gate via 194B physically contacts gate stack 140C, and butted contact/via 196 physically contacts source/drain contact 180B (in particular, metal plug 178B) and gate stack 140D. Because the vias and butted contacts extend below ILD layer 150, nitrogen-containing crust 150' and contact spacers 174S are between lower portions of source/drain vias 192A, 192B and untreated portions of ILD layer 150 (FIG. 13B), gate spacers 145 and/or contact spacers 174S are between lower portions of source/drain vias 192A, 192B and SAC features 168A-168D (FIG. 13C), gate spacers 145 and/or SAC features 168A-168D are between gate vias 194A, 194B and ILD layer 150 (FIG. 13C), gate spacers 145 and/or SAC features 168A-168D are between butted contact 196 and ILD layer 150 (FIG. 13C), and gate spacers 145 and/or contact spacers 174S are between butted contact 196 and SAC features 168A-168D (FIG. 13C). Further, gate spacers 145, SAC features 168A-168D, contact spacers 174S, or combinations thereof are between first lower portion and second lower portion of butted contact 196 (FIG. 13C). In some embodiments, nitrogen-containing crust 150' and contact spacers 174S may be between butted contact 196 and untreated portions of ILD layer 150.

Source/drain vias 192A, 192B, gate vias 194A, 194B, and butted contact 196 may be formed by depositing a barrier material over ILD layer 184 that partially fills source/drain via openings 186A, 186B, gate via openings 188A, 188B, and butted contact opening 190; depositing a bulk (fill)

metal material over the barrier material, where the bulk metal material fills a remainder of source/drain via openings 186A, 186B, gate via openings 188A, 188B, and butted contact opening 190; and performing a planarization process (e.g., CMP) to remove excess bulk metal material and excess barrier material, such as that over top surface of ILD layer 184. Remainders of the barrier material and the bulk material form barrier layers and conductive plugs (e.g., metal plugs) of source/drain vias 192A, 192B, gate vias 194A, 194B, and butted contact 196, where the barrier layers are between the conductive plugs and surrounding dielectric material (e.g., ILD layer 184, CESL 182, contact spacers 174S, SAC features 168A-168D, or combinations thereof). The barrier material and the bulk material can be deposited by CVD, PVD, ALD, HDPCVD, MOCVD, RPCVD, PECVD, LPCVD, ALCVD, APCVD, PEALD, electroplating, electroless plating, other suitable method, or combinations thereof. The barrier material and the bulk material can be deposited using fluorine-containing precursors.

The barrier material includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, the barrier material includes more than one layer, such as a metal nitride layer, a first metal liner, and a second metal liner. The bulk metal material, the first metal liner, and the second metal liner include aluminum, copper, titanium, tantalum, tungsten, ruthenium, molybdenum, cobalt, iridium, palladium, platinum, nickel, tin, gold, silver, other suitable metals, alloys thereof, silicides thereof, or combinations thereof. In some embodiments, source/drain vias 192A, 192B, gate vias 194A, 194B, butted contact 196, or combinations thereof include a tri-layer barrier (i.e., a titanium nitride layer or a tantalum nitride layer, a cobalt layer, and a ruthenium layer) and a copper plug. In some embodiments, source/drain vias 192A, 192B, gate vias 194A, 194B, butted contact 196, or combinations thereof include a cobalt plug, a tungsten plug, a ruthenium plug, or a copper plug. In some embodiments, source/drain vias 192A, 192B, gate vias 194A, 194B, butted contact 196, or combinations thereof do not include electrically conductive barrier and/or liner layers. In such embodiments, source/drain vias 192A, 192B, gate vias 194A, 194B, butted contact 196, or combinations thereof include conductive plugs having sidewalls that physically contact ILD layer 184 and/or CESL 182 or dielectric barriers, such as contact spacers, between conductive plugs and ILD layer 184 and/or CESL 182.

Figure 14:
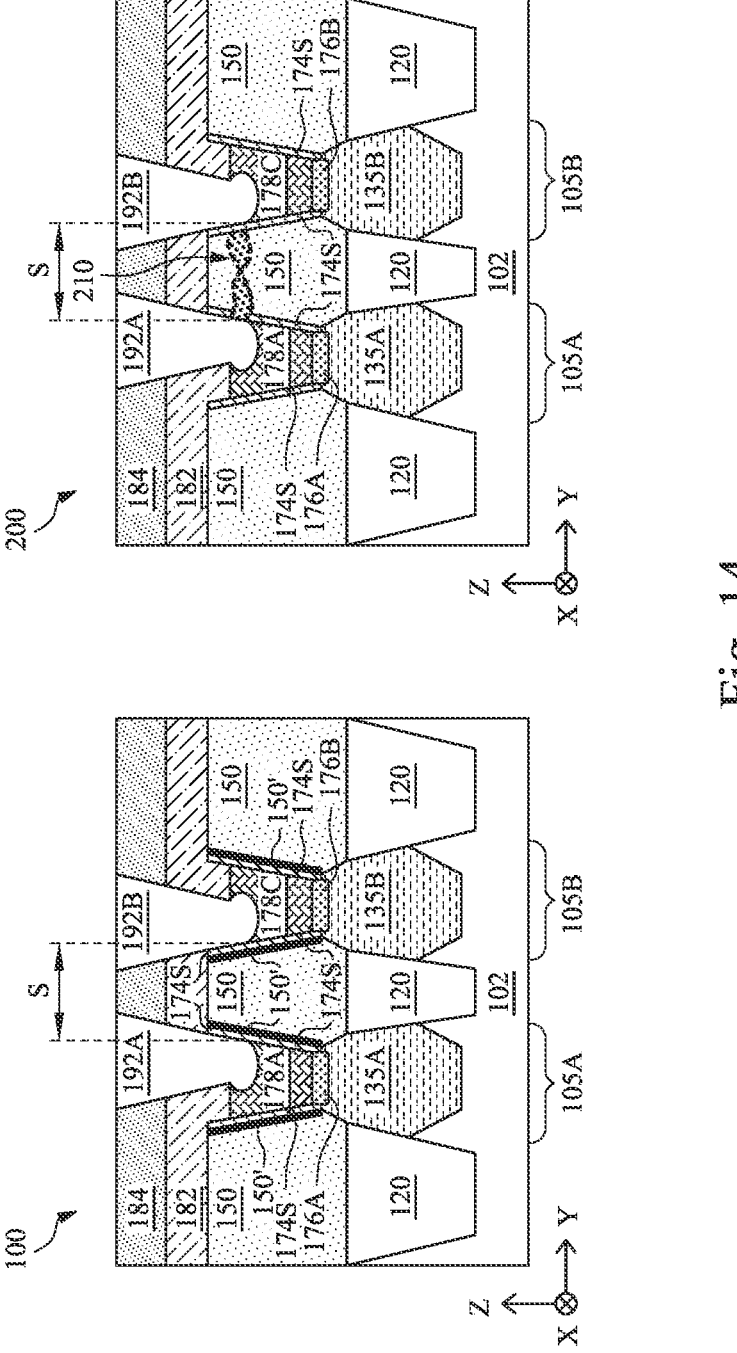
FIG. 14 provides diagrammatic cross-sectional views of a device with interconnect structures having dielectric layers with nitrogen-containing crusts, in portion or entirety, and a device with interconnect structures having dielectric layers without nitrogen-containing crusts, in portion or entirety, according to various aspects of the present disclosure.

Fluorine-based metal precursors used to deposit metal layers of source/drain vias 192A, 192B, gate vias 194A, 194B, butted contact 196, or combinations thereof, such as metal plugs thereof, have been observed to attack underlying conductive features, such as source/drain contacts 180A-180C, and/or underlying dielectric features, such as ILD layer 150 and/or contact spacers 174S. Fluorine-based etchants used to form source/drain via openings 186A, 186B, gate via openings 188A, 188B, butted contact opening 190, or combinations thereof have also been observed to attack the underlying conductive features and/or underlying dielectric features. Turning to FIG. 14, which depicts a device 200 without nitrogen-containing crust 150', fluorine attacks have been observed to damage ILD layer 150 and/or contact spacers 174S, which make it easier for metal constituents to diffuse/penetrate into ILD layer 150 and degrade device performance. For example, diffusion/penetration of metal constituents into contact spacers 174S and/or ILD layer 150 can lead to a signal/current leakage path 210 between source/drain via 192A and source/drain via 192B (i.e., via-to-via leak), particularly as a spacing S between source/drain via 192A and source/drain via 192B decreases with scaling IC technology nodes. In some instances, diffused/penetrated metal constituents can form a metal connection between source/drain via 192A and source/drain via 192B, which can lead to an electrical short. Via-to-via leaks and/or shorting is more likely when spacing S is less than about 25 nm, such as when spacing S about 17 nm to about 23 nm, in some embodiments.

Increasing a thickness of contact spacers 174S (i.e., increase thickness T3) in device 200 is one way to enhance metal blocking capabilities of the interconnect of device 200. However, increasing the thickness of contact spacers 174S correspondingly decreases dimensions (e.g., widths and/or lengths) and/or volumes of metal layers of source/drain contacts 180A-180C, which also reduces a contact area between source/drain contacts 180A-180C and source/drain vias 192A, 192B (i.e., a contact landing area). Smaller interconnect dimensions and/or volumes, along with smaller contact landing areas, have been observed to undesirably increase parasitic resistance of interconnect. Accordingly, increasing the thickness of contact spacers 174S to improve an interconnect's metal blocking properties needs to account for any increases in parasitic resistance that may occur from corresponding reductions in the interconnect's dimensions, volumes, and/or contact areas of its metal layers.

The interconnect of device 100, which includes a metal blocking structure having nitrogen-containing crust 150' and contact spacers 174S, remedies such trade-offs by improving an interconnect's metal blocking properties without reducing the interconnect's dimensions, volumes, or contact areas of its metal layers. As described herein, improved metal blocking capabilities of the interconnect are provided by converting a portion of ILD layer 150 into nitrogen-containing crust 150', instead of by inserting another diffusion/barrier layer between its metal layers (e.g., metal plugs 178A-178C) and ILD layer 150 and/or by increasing thickness of contact spacers 174S. Nitrogen-containing crust 150' is resistant to metal penetration/diffusion and exhibits better metal blocking capabilities than untreated portions of ILD layer 150. Nitrogen-containing crust 150' is also resistant to fluorine attack, such as those that may arise from fluorine-based metal precursors during deposition and/or fluorine-based etchants during etching. Further, since the metal blocking structure includes nitrogen-containing crust 150' and contact spacers 174S, instead of contact spacers 174S alone, thickness T3 of contact spacers 174S can be less than about 2.5 nm. In some embodiments, thickness T3 of contact spacers 174S is about 0.8 nm to about 2 nm. Contact spacers 174S with such thicknesses can enhance metal blocking capabilities of the interconnect without consuming too much space, thereby maximizing dimensions and/or volumes of conductive portions of the interconnect, particularly for 20 nm and below IC technology nodes. Metal blocking capabilities and/or fluorine resistance of the interconnect of device 100 is thus better than that of device 200, and such improvements are achieved without increasing parasitic resistance. In some embodiments, contact spacers 174S can be eliminated from source/drain contacts 180A-180C, and conductive portions of source/drain contacts 180A-180C (e.g., metal plugs 178A-178C) can physically contact nitrogen-containing crust 150'. Different embodiments may have different advantages, and no particular advantage is required of any embodiment.

In some embodiments, source/drain vias 192A, 192B, gate vias 194A, 194B, butted contact 196, or combinations thereof are formed by separate process. For example, source/drain vias 192A, 192B, gate vias 194A, 194B, butted contact 196, or combinations thereof are formed by separate deposition processes. In some embodiments, source/drain via openings 186A, 186B, gate via openings 188A, 188B, butted contact opening 190, or combinations thereof are formed by separate process. For example, source/drain via openings 186A, 186B, gate via openings 188A, 188B, butted contact opening 190, or combinations thereof are formed by separate patterning processes. In some embodiments, fabrication can include a first set of processes for forming source/drain via openings 186A, 186B and/or source/drain vias 192A, 192B, a second set of processes for forming gate via openings 188A, 188B and/or gate vias 194A, 194B, and a third set of processes for forming butted contact opening 190 and/or butted contact 196. The first, second, and third set of processes can have at least one step in common (e.g., a same deposition process) or no steps in common (e.g., masking can be used to cover gate via areas and butted contact areas while forming source/drain vias, etc.).

Figure 15A:
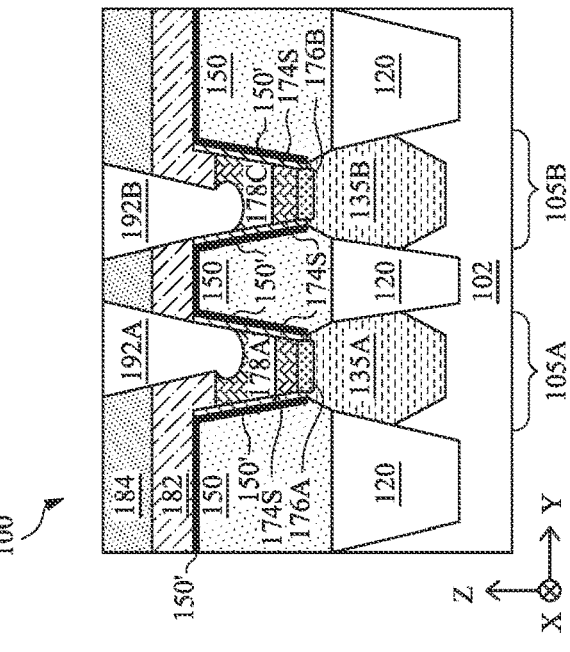
FIG. 15A and FIG. 15B are diagrammatic cross-sectional views of another device with interconnect structures having dielectric layers with nitrogen-containing crusts, in portion or entirety, according to various aspects of the present disclosure.
Figure 15B:
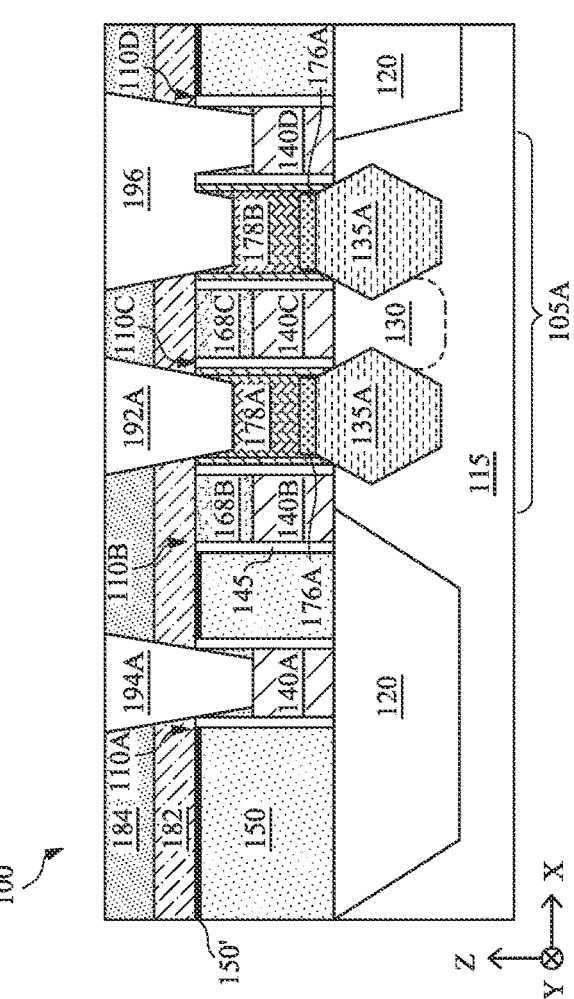

In some embodiments, such as depicted in FIG. 15A and FIG. 15B, ILD layer 155 may not be formed over ILD layer 150 and nitrogen plasma 170 may convert a top portion of ILD layer 150 into nitrogen-containing crust 150'. In such embodiments, nitrogen-containing crust 150' forms a top surface of ILD layer 150, nitrogen-containing crust 150' is between and overlying dielectric layer (e.g., ILD layer 184 and/or CESL 182) and untreated portions of ILD layer 150, and nitrogen-containing crust 150' may physically contact CESL 182.

Figure 16:
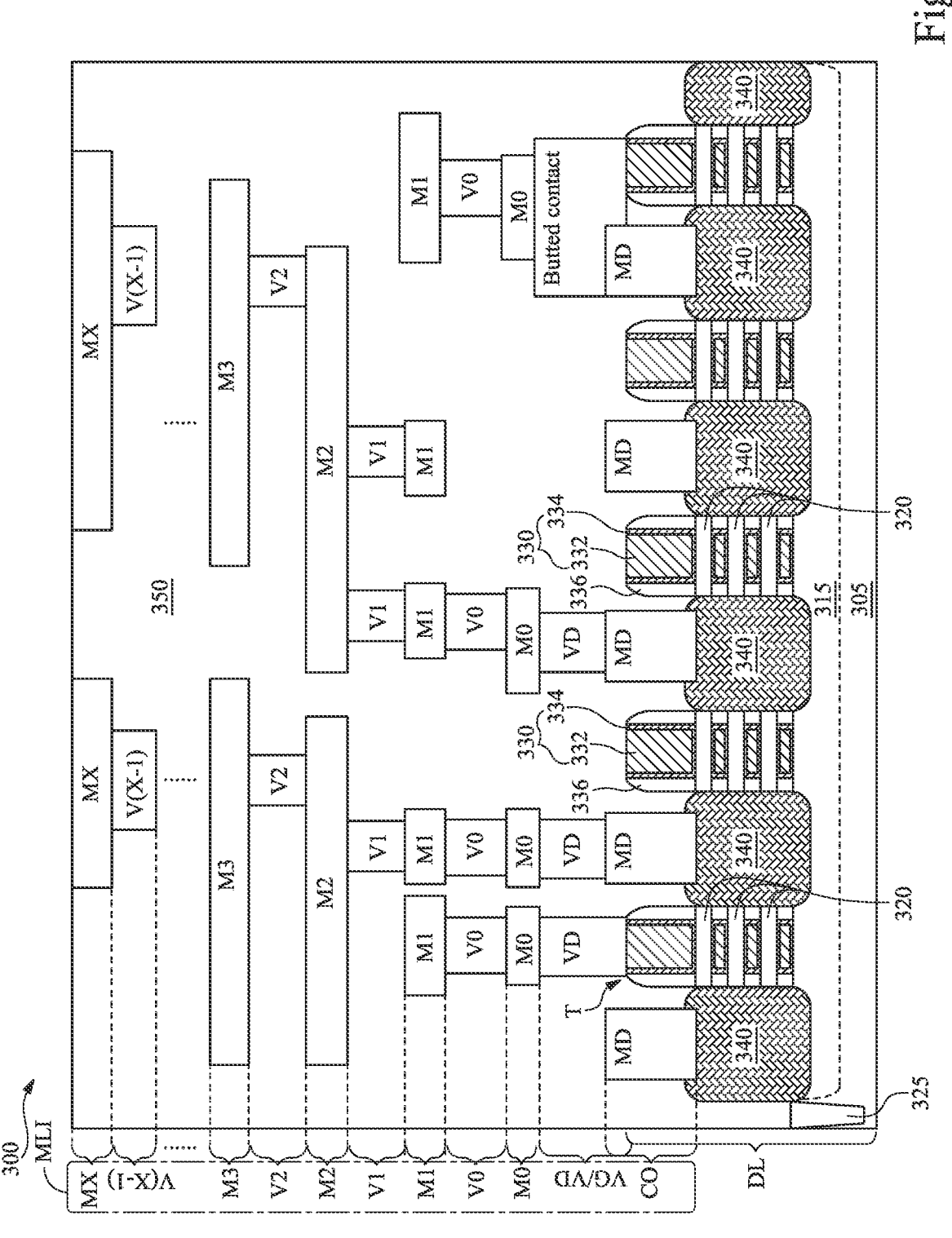
FIG. 16 is a diagrammatic cross-sectional view of various layers (levels) of a device, in portion or entirety, according to various aspects of the present disclosure.

The present disclosure contemplates implementing nitrogen-plasma treatments on ILD layers and/or providing ILD layers with nitrogen-containing crusts, such as as described herein, at various layers of an MLI. FIG. 16 is a fragmentary diagrammatic cross-sectional view of various layers (levels) that can be fabricated over a substrate (wafer) 305, which is similar to substrate 115, to form a device 300, or portion thereof, according to various aspects of the present disclosure. In FIG. 16, the various layers include a device layer DL and a multilayer interconnect MLI disposed over device layer DL. Device layer DL can include circuitry fabricated thereon and/or thereover by front-end-of-line (FEOL) processing and multilayer interconnect MLI can include circuitry fabricated on and/or over device layer DL by middle-of-line (MOL) processing and/or back-end-of-line (BEOL) processing. Device 300 may be included in a microprocessor, a memory, IC device, or combinations thereof. In some embodiments, device 300 is a portion of an IC chip and/or an SoC that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 16 has been simplified for the sake of clarity to better understand the inventive concepts of the present disclosure. Additional features can be added in device 300, and some of the features described below can be replaced, modified, or eliminated in other embodiments of device 300.

Device layer DL can include passive microelectronic devices and/or active microelectronic devices, such as resistors, capacitors, inductors, diodes, PFETs, NFETs, MOSFETs, CMOS transistors, BJTs, LDMOS transistors, high voltage transistors, high frequency transistors, other devices, or combinations thereof. The various microelectronic devices can be configured to provide functionally distinct regions of an IC, such as a logic region (i.e., a core region), a memory region, an analog region, a peripheral region (e.g., an input/output region), a dummy region, other suitable region, or combinations thereof. The logic region may be configured with standard cells, each of which can provide a logic device and/or a logic function, such as an inverter, an AND gate, an NAND gate, an OR gate, an NOR gate, a NOT gate, an XOR gate, an XNOR gate, other suitable logic device, or combinations thereof. The memory region may be configured with memory cells, each of which can provide a storage device and/or storage function, such as flash memory, non-volatile random-access memory, static random-access memory, dynamic random-access memory, other volatile memory, other non-volatile memory, other suitable memory, or combinations thereof. In some embodiments, memory cells and/or logic cells include transistors and interconnect structures that combine to provide storage devices/functions and logic devices/functions, respectively.

Device layer DL includes device components, such as substrate 305 (similar to substrate 115), doped regions/wells 315 (e.g., n-wells and/or p-wells), channels 320 disposed over and/or within substrate 305 (similar to channel layers 130), isolation features 325 (similar to isolation features 120), gate stacks 330 having gate electrodes 332 and gate dielectrics 334 (similar to gate stacks 140A-140D), gate spacers 336 along sidewalls of gate stacks 330 (similar to gate spacers 145), epitaxial source/drains 340 (similar to epitaxial source/drains 135A, 135B), other device components/features, or combinations thereof. In the depicted embodiment, device layer DL includes transistors T having channel layers 320 suspended over substrate 305 and extending between epitaxial source/drains 340, where gate stacks 330 of transistors T are disposed on and surround channel layers 320. In such embodiments, transistors T of device layer DL are GAA transistors. The various transistors of device layer DL can be configured as planar transistors or non-planar transistors depending on design requirements.

Multilayer interconnect MLI electrically connects devices of device layer DL (e.g., transistors T), components of device layer DL, devices (e.g., a memory device) within multilayer interconnect MLI, components of multilayer interconnect MLI, or combinations thereof, such that the various devices and/or components can operate as specified by design requirements of device 300. Multilayer interconnect MLI includes a combination of dielectric layers (generally depicted as an insulation layer 350) and electrically conductive layers (e.g., patterned metal layers formed by conductive lines, conductive vias, conductive contacts, or combinations thereof) configured to form interconnect (routing) structures. The conductive layers form vertical interconnect structures, such as device-level contacts and/or vias, that connect horizontal interconnect structures, such as conductive lines, in different layers/levels (or different planes) of multilayer interconnect MLI. In some embodiments, the interconnect structures route electrical signals between devices and/or components of device layer DL and/or multilayer interconnect MLI. In some embodiments, the interconnect structures distribute electrical signals (for example, clock signals, voltage signals, and/or ground signals) to the devices and/or the device components of device layer DL and/or multilayer interconnect MLI.

In FIG. 16, multilayer interconnect MLI includes a device-level contact layer (CO level), a device-level via layer (VG/VD level), a metal zero layer (M0 level), a via zero layer (V0 level), a metal one layer (M1 level), a via one layer (V1 level), a metal two layer (M2 level), a via two layer (V2 level), a metal three layer (M3 level) and so on up to a via (X-1) layer (V(X-1) level) and a metal X layer (MX level). X is an integer greater than or equal to 1. Each level of multilayer interconnect MLI includes a respective electrically conductive layer (e.g., conductive lines, conductive vias, conductive contacts, or combinations thereof) disposed in a respective insulation layer (e.g., an ILD layer and/or a CESL). For example, CO level includes a portion of insulation layer 350 having source/drain contacts MD (e.g., source/drain contacts 180A-180C) disposed therein. VG/VD level includes a portion of insulation layer 350 having gate vias VG (e.g., gate vias 194A, 194B), source/drain vias VD (e.g., source/drain vias 192A, 192B), and butted contacts MP (e.g., butted contact 196) disposed therein. M0 level includes a portion of insulation layer 350 having M0 lines disposed therein, where gate vias VG connect gate stacks 330 to M0 lines, source/drain vias VD connect source/drain contacts MD to M0 lines, and butted contacts connect source/drain contacts MD and gate stacks 330 to M0 lines. V0 level includes a portion of insulation layer 350 having V0 vias disposed therein, where V0 vias connect M0 lines to M1 lines. M1 level includes a portion of insulation layer 350 having M1 lines disposed therein. V1 level includes a portion of insulation layer 350 having V1 vias disposed therein, where V1 vias connect M1 lines to M2 lines. M2 level includes a portion of insulation layer 350 having M2 lines disposed therein. V2 level includes a portion of insulation layer 350 having V2 vias disposed therein, where V2 vias connect M2 lines to M3 lines. M3 level includes a portion of insulation layer 350 having M3 lines disposed therein. V(X-1) level includes a portion of insulation layer 350 having V(X-1) vias disposed therein, where V(X-1) vias connect M(X-1) lines to MX lines. MX level includes a portion of insulation layer 350 having MX lines disposed therein.

Interconnects of one or more of the levels (layers) of multilayer interconnect MLI have ILD layers with nitrogen-containing crusts. For example, the portion of insulation layer 350 of a given level of multilayer interconnect MLI can include an ILD layer having nitrogen-containing crust as described herein, where electrically conductive portions of the interconnects of the given level are separated from untreated portions of the ILD layer by the nitrogen-containing crust of the ILD layer. In some embodiments, the portion of insulation layer 350 of the given level further includes a CESL. The CESL may be disposed between the ILD layer and an ILD layer of an underlying level of multilayer interconnect MLI.

Figure 17A:
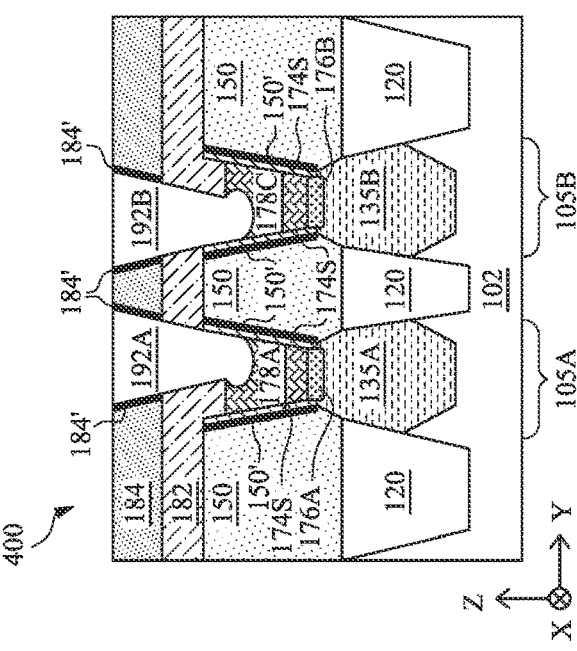
FIG. 17A and FIG. 17B are diagrammatic cross-sectional views of another device with interconnect structures having dielectric layers with nitrogen-containing crusts, in portion or entirety, according to various aspects of the present disclosure.
Figure 17B:
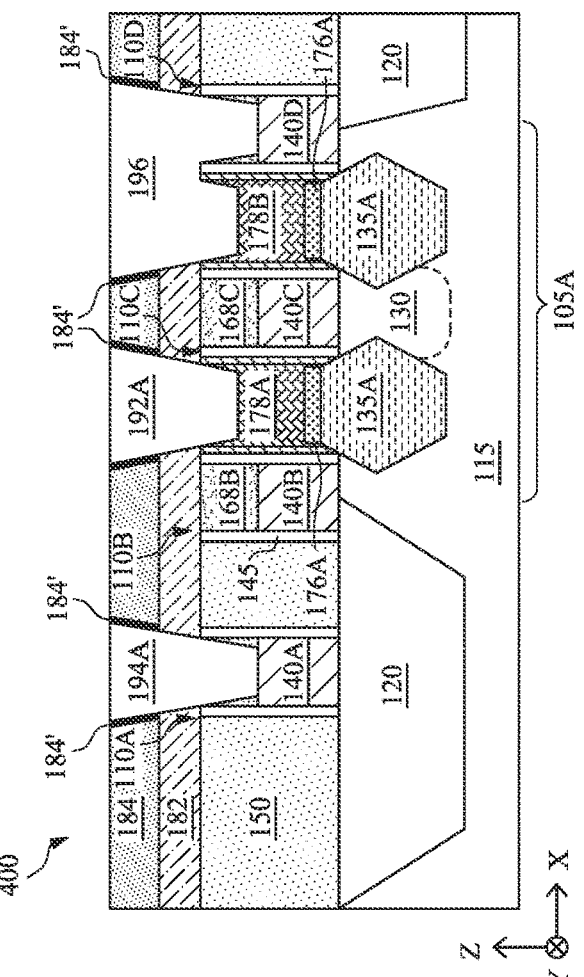

FIG. 17A and FIG. 17B are fragmentary diagrammatic cross-sectional views of a device 400, in portion or entirety, having a CO/MD level and a VD/VG level of a multilayer interconnect MLI that include ILD layers with nitrogen-containing crusts according to various aspects of the present disclosure. Device 400 is similar in many respects to device 100 of FIGS. 13A-13C. Accordingly, similar features in FIG. 17A, FIG. 17B, and FIGS. 13A-13C are identified by the same reference numerals for clarity and simplicity. FIG. 17A and FIG. 17B have been simplified for the sake of clarity to better understand the inventive concepts of the present disclosure. Additional features can be added in device 400, and some of the features described can be replaced, modified, or eliminated in other embodiments of device 400.

Device 400 is fabricated similar to device 100, but during fabrication of device 400, a nitrogen plasma treatment, similar to nitrogen plasma treatment 170, is performed on ILD layer 184 after forming source/drain via openings 186A, 186B, gate via openings 188A, 188B, and butted contact opening 190, such that portions of ILD layer 184 are converted into a nitrogen-containing crust 184'. Nitrogen-containing crust 184' is between sidewalls of source/drain vias 192A, 192B and untreated portions of ILD layer 184, sidewalls of gate vias 194A, 194B and untreated portions of ILD layer 184, and sidewalls of butted contact opening 196 and untreated portions of ILD layer 184. In some embodiments, nitrogen-containing crust 184' forms a top surface of ILD layer 184. In embodiments where ILD layer 184 includes silicon and oxygen (e.g., an $SiO_x$ layer or an SiOC layer), nitrogen-containing crust 184' includes silicon, oxygen, and nitrogen (e.g., an SiON crust or an SiOCN crust). In some embodiments, nitrogen-containing crust 184' is provided between source/drain vias 192A, 192B and ILD layer 184, but not gate vias 194A, 194B and ILD layer 184 and/or butted contact 196 and ILD layer 184. In some embodiments, nitrogen-containing crust 184' is provided between gate vias 194A, 194B and ILD layer 184, but not source/drain vias 192A, 192B and ILD layer 184 and/or butted contact 196 and ILD layer 184. In some embodiments, nitrogen-containing crust 184' is provided between butted contact 196 and ILD layer 184, but not source/drain vias 192A, 192B and ILD layer 184 and/or gate vias 194A, 194B and ILD layer 184.

Nitrogen-containing crust 184' can prevent and/or hinder metal constituents from source/drain vias 192A, 192B, gate vias 194A, 194B, butted contacts 196, or combinations thereof from penetrating into ILD layer 184. Nitrogen-containing crust 184' can also resist fluorine-based attacks during fabrication of source/drain vias 192A, 192B, gate vias 194A, 194B, butted contacts 196, or combinations thereof. Further, nitrogen-containing crust 184' improves metal diffusion/penetration blocking capabilities of the VD/VG level's interconnects without reducing volumes and/or dimensions of electrically conductive portions of the interconnects, such as volumes and/or dimensions of metal layers of source/drain vias 192A, 192B, gate vias 194A, 194B, butted contacts 196, or combinations thereof. Accordingly, nitrogen-containing crust 184' can improve metal diffusion/penetration blocking capabilities of the VD/VG level's interconnects without increasing parasitic contact resistance. Different embodiments may have different advantages, and no particular advantage is required of any embodiment.

Figures 18A, 18B:
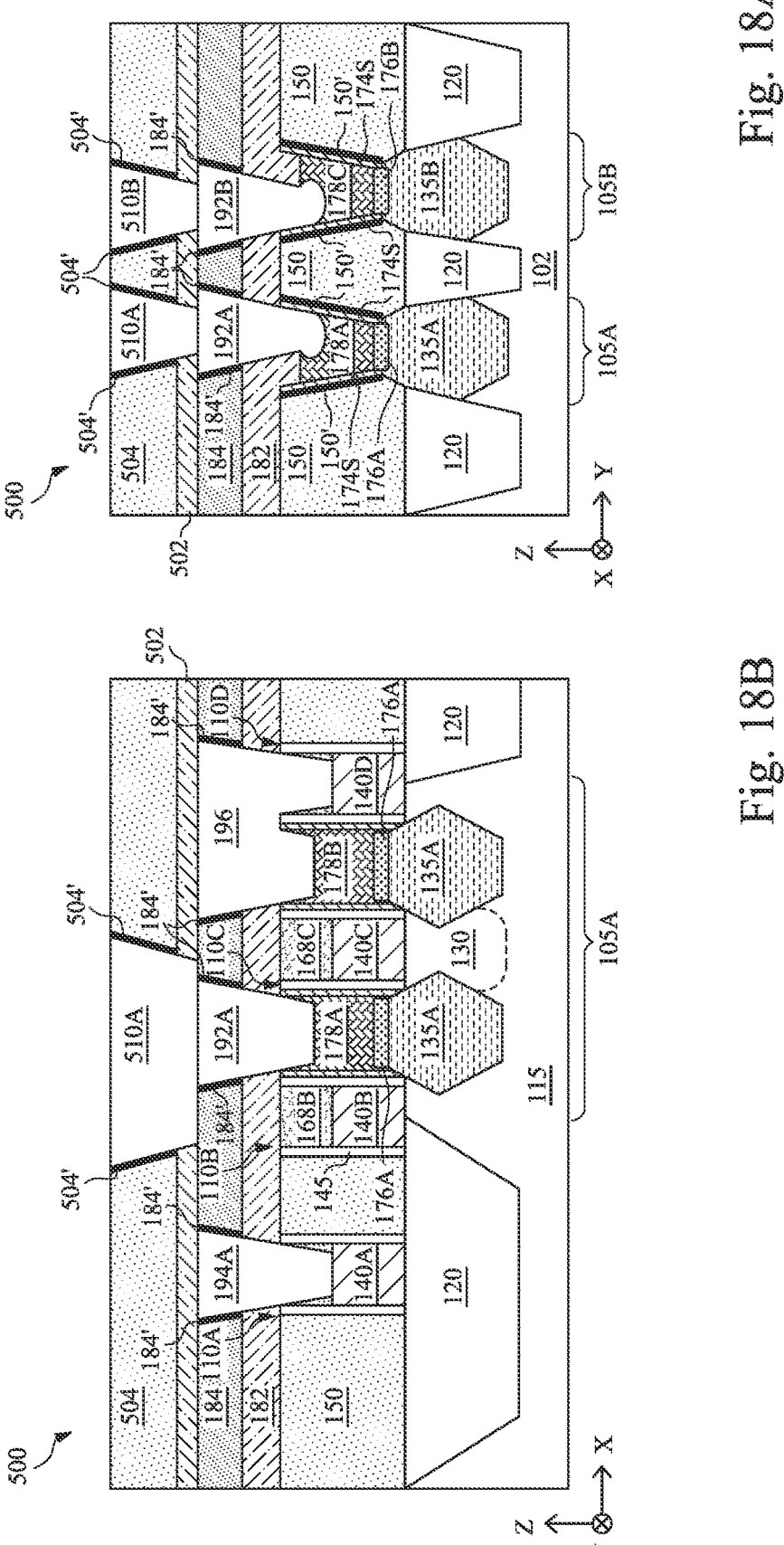
FIG. 18A and FIG. 18B are diagrammatic cross-sectional views of yet another device with interconnect structures having dielectric layers with nitrogen-containing crusts, in portion or entirety, according to various aspects of the present disclosure.

FIG. 18A and FIG. 18B are fragmentary diagrammatic cross-sectional views of a device 500, in portion or entirety, having a CO/MD level, a VD/VG level, and an M0 level of a multilayer interconnect MLI that include ILD layers with nitrogen-containing crusts according to various aspects of the present disclosure. Device 500 is similar in many respects to device 100 of FIGS. 13A-13C and device 400 of FIG. 17A and FIG. 17B. Accordingly, similar features in FIG. 18A, FIG. 18B, FIGS. 13A-13C, FIG. 17A, and FIG. 17B are identified by the same reference numerals for clarity and simplicity. FIG. 18A and FIG. 18B have been simplified for the sake of clarity to better understand the inventive concepts of the present disclosure. Additional features can be added in device 500, and some of the features described can be replaced, modified, or eliminated in other embodiments of device 500.

Device 500 is fabricated similar to device 100 and/or device 400. Device 500 further includes an M0 level that includes a CESL 502 (configured and/or fabricated similar to CESL 182), an ILD layer 504 (configured and/or fabricated similar to ILD layer 184), and M0 lines, such as a metal line 510A and a metal line 510B. Metal line 510A extends through ILD layer 504 and CESL 502 to physically contact source/drain via 192A, and metal line 510B extends through ILD layer 504 and CESL 502 to physically contact source/drain via 192B. Metal line 510A and metal line 510B can be configured and/or fabricated similar to source/drain vias 192A, 192B, gate vias 194A, 194B, butted contacts 196, or combinations thereof. During fabrication of M0 level, a nitrogen plasma treatment, similar to nitrogen plasma treatment 170, is performed on ILD layer 504 after forming contact openings therein and before forming metal lines in the contact openings. The nitrogen plasma treatment is configured to convert portions of ILD layer into a nitrogen-containing crust 504'. Nitrogen-containing crust 504' is between sidewalls of metal lines 510A, 510B and untreated portions of ILD layer 504. In some embodiments, nitrogen-containing crust 504' forms a top surface of ILD layer 504. In some embodiments, nitrogen-containing crust 184' forms a top surface of ILD layer 184, such that nitrogen-containing crust 184' is between CESL 502 and untreated portion of ILD layer 184. In embodiments where ILD layer 504 includes silicon and oxygen (e.g., an $SiO_x$ layer or an SiOC layer), nitrogen-containing crust 504' includes silicon, oxygen, and nitrogen (e.g., an SiON crust or an SiOCN crust). In some embodiments, device 500 is provided with nitrogen-containing crust 504' but not nitrogen-containing crust 184' and/or nitrogen-containing crust 150'.

Nitrogen-containing crust 504' can prevent and/or hinder metal constituents from metal lines 510A, 510B from penetrating into ILD layer 504. Nitrogen-containing crust 504' can also resist fluorine-based attacks during fabrication of metal lines 510A, 510B. Further, nitrogen-containing crust 504' improves metal diffusion/penetration blocking capabilities of the M0 level's interconnects without reducing volumes and/or dimensions of electrically conductive portions of the interconnects, such as volumes and/or dimensions of electrically conductive portions of metal lines 510A, 510B. Accordingly, nitrogen-containing crust 504' can improve metal diffusion/penetration blocking capabilities of the M0 level's interconnects without increasing parasitic contact resistance. Different embodiments may have different advantages, and no particular advantage is required of any embodiment.

The present disclosure provides for many different embodiments. Interconnect structures having dielectric layers with nitrogen-containing crusts and methods of fabrication thereof are disclosed herein. An exemplary method includes forming a first interconnect opening in a first interlayer dielectric (ILD) layer that exposes an underlying conductive feature, such as a source/drain, a gate, a contact, a via, or a conductive line. The method includes nitridizing sidewalls of the first interconnect opening, which are formed by the first ILD layer, before forming a first metal contact in the first interconnect opening. The nitridizing converts a portion of the first ILD layer into a nitrogen-containing crust. The first metal contact can include a metal plug and dielectric spacers between the metal plug and the nitrogen-containing crust of the first ILD layer. The method can include forming a second interconnect opening in a second ILD layer that exposes the first metal contact and forming a second metal contact in the second interconnect opening. In some embodiments, the method further includes nitridizing sidewalls of the second interconnect opening formed by the second ILD layer before forming the second metal contact. In some embodiments, the method further includes forming a dielectric liner in the first interconnect opening before forming the first metal contact.

In some embodiments, the method further includes forming a contact etch stop layer (CESL) over the first ILD layer, forming the second ILD layer over the CESL, and extending the second interconnect opening through the CESL. In some embodiments, the method can further include nitridizing a top surface of the first ILD layer. In some embodiments, nitridizing the sidewalls of the first interconnect opening formed by the first ILD layer and/or nitridizing the sidewalls of the second interconnect opening formed by the second ILD layer includes exposing the first ILD layer to an $N_2$ plasma. In some embodiments, forming the second metal contact includes exposing the first ILD layer to a fluorine-based metal precursor.

Another exemplary method includes forming a source/drain contact opening in a dielectric layer that exposes a source/drain, performing a nitrogen plasma treatment on the dielectric layer to convert a portion of the dielectric layer into a nitrogen-containing crust, and after performing the nitrogen plasma treatment, forming a source/drain contact in the dielectric layer. The nitrogen-containing crust is between sidewalls of the source/drain contact and the dielectric layer. In some embodiments, forming the source/drain contact in the dielectric layer after performing the nitrogen plasma treatment includes forming dielectric contact spacers along the sidewalls of the source/drain contact opening and forming a metal layer over the source/drain and the dielectric contact spacers. The metal layer fills a remainder of the source/drain contact opening, and the nitrogen-containing crust of the dielectric layer forms the sidewalls of the source/drain contact opening. In some embodiments, forming the dielectric contact spacers includes depositing a silicon nitride layer and etching the silicon nitride layer.

In some embodiments, the dielectric layer is a first dielectric layer. In such embodiments, the method can further include forming a second dielectric layer over the first dielectric layer, forming a source/drain via opening in the second dielectric layer that exposes the source/drain contact, extending the source/drain via opening into the source/drain contact, and forming a source/drain via in the source/drain via opening. In some embodiments, at least one of the forming the source/drain via opening, the extending the source/drain via opening, or the forming the source/drain via include using a fluorine-containing precursor. In some embodiments, the nitrogen plasma treatment is a first nitrogen plasma treatment, the nitrogen-containing crust is a first nitrogen-containing crust, and the method further includes, before forming the source/drain via, performing a second nitrogen plasma treatment on the second dielectric layer to convert a portion of the second dielectric layer into a second nitrogen-containing crust. In some embodiments, the second dielectric layer includes an ILD layer disposed over a CESL, and the second nitrogen-containing plasma treatment converts a portion of the ILD layer into the second nitrogen-containing crust.

In some embodiments, forming the source/drain contact opening in the dielectric layer includes forming a first ILD layer over the source/drain, forming a second ILD layer over the first ILD layer, and patterning the second ILD layer and the first ILD layer. The source/drain contact opening has a bottom formed by the source/drain and the sidewalls formed by the first ILD layer and the second ILD layer. In some embodiments, performing the nitrogen plasma treatment on the dielectric layer to convert the portion of the dielectric layer into the nitrogen-containing crust includes converting portions of the first ILD layer into a first nitrogen-containing crust and portions of the second ILD layer into a second nitrogen-containing crust, such that the sidewalls of the source/drain contact opening are formed by the first nitrogen-containing crust and the second nitrogen-containing crust. In some embodiments, forming the source/drain contact in the dielectric layer after performing the nitrogen plasma treatment includes depositing a metal material over the second ILD layer, where the metal material fills the source/drain contact opening, and performing a planarization process that removes the second ILD layer and excess metal material, thereby forming a metal plug of the source/drain contact.

An exemplary interconnect structure includes a dielectric layer having a nitrogen-containing crust and a source/drain contact disposed in the dielectric layer. The source/drain contact includes a metal plug and contact spacers. The contact spacers are disposed between sidewalls of the metal plug and the nitrogen-containing crust of the dielectric layer. In some embodiments, the dielectric layer includes silicon and oxygen, the nitrogen-containing crust includes silicon, oxygen, and nitrogen, the contact spacers include silicon and nitrogen, and the metal plug includes cobalt, ruthenium, or tungsten. In some embodiments, a nitrogen concentration of the nitrogen-containing crust is about 3% to about 30%. In some embodiments, the contact spacers physically contact the metal plug and the nitrogen-containing crust of the dielectric layer. In some embodiments, the interconnect structure further includes a source/drain via that extends into the source/drain contact. The contact spacers are further disposed between the source/drain via and the nitrogen-containing crust of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising
   forming a source/drain contact opening in a dielectric layer, wherein the source/drain contact opening exposes a source/drain;
   performing a nitrogen plasma treatment on the dielectric layer to convert a portion of the dielectric layer into a nitrogen-containing crust; and
   after performing the nitrogen plasma treatment, forming a source/drain contact in the dielectric layer, wherein the nitrogen-containing crust is between sidewalls of the source/drain contact and the dielectric layer.

2. The method of claim 1, wherein the forming the source/drain contact in the dielectric layer after performing the nitrogen plasma treatment includes:
   forming dielectric contact spacers along the sidewalls of the source/drain contact opening, wherein the nitrogen-containing crust of the dielectric layer forms the sidewalls of the source/drain contact opening; and
   forming a metal layer over the source/drain and the dielectric contact spacers, wherein the metal layer fills a remainder of the source/drain contact opening.

3. The method of claim 2, wherein the forming the dielectric contact spacers includes depositing a silicon nitride layer and etching the silicon nitride layer.

4. The method of claim 1, wherein the dielectric layer is a first dielectric layer, the method further comprising:

forming a second dielectric layer over the first dielectric layer;

forming a source/drain via opening in the second dielectric layer, wherein the source/drain via opening exposes the source/drain contact;

extending the source/drain via opening into the source/drain contact; and forming a source/drain via in the source/drain via opening.

5. The method of claim 4, wherein at least one of the forming the source/drain via opening, the extending the source/drain via opening, or the forming the source/drain via include using a fluorine-containing precursor.

6. The method of claim 4, wherein the nitrogen plasma treatment is a first nitrogen plasma treatment, the nitrogen-containing crust is a first nitrogen-containing crust, and the method further comprises:

before forming the source/drain via, performing a second nitrogen plasma treatment on the second dielectric layer to convert a portion of the second dielectric layer into a second nitrogen-containing crust.

7. The method of claim 6, wherein the second dielectric layer includes an interlayer dielectric (ILD) layer disposed over a contact etch stop layer (CESL), and the second nitrogen-containing plasma treatment converts a portion of the ILD layer into the second nitrogen-containing crust.

8. The method of claim 1, wherein:

the forming the source/drain contact opening in the dielectric layer includes:

forming a first interlayer dielectric (ILD) layer over the source/drain, forming a second ILD layer over the first ILD layer, and patterning the second ILD layer and the first ILD layer, wherein the source/drain contact opening has a bottom formed by the source/drain and the sidewalls formed by the first ILD layer and the second ILD layer; and the performing the nitrogen plasma treatment on the dielectric layer to convert the portion of the dielectric layer into the nitrogen-containing crust includes converting portions of the first ILD layer into a first nitrogen-containing crust and portions of the second ILD layer into a second nitrogen-containing crust, such that the sidewalls of the source/drain contact opening are formed by the first nitrogen-containing crust and the second nitrogen-containing crust.

9. The method of claim 8, wherein the forming the source/drain contact in the dielectric layer after performing the nitrogen plasma treatment includes:

depositing a metal material over the second ILD layer, wherein the metal material fills the source/drain contact opening; and performing a planarization process that removes the second ILD layer and excess metal material, thereby forming a metal plug of the source/drain contact.

10. A method comprising:

forming a first interlayer dielectric (ILD) layer;

forming a first interconnect opening in the first ILD layer, wherein the first interconnect opening exposes an underlying conductive feature;

after nitridizing sidewalls of the first interconnect opening formed by the first ILD layer, forming a first metal contact in the first interconnect opening;

forming a second ILD layer over the first ILD layer;

forming a second interconnect opening in the second ILD layer, wherein the second interconnect opening exposes the first metal contact; and forming a second metal contact in the second ILD layer, wherein the second metal contact abuts the first metal contact.

11. The method of claim 10, further comprising nitridizing sidewalls of the second interconnect opening formed by the second ILD layer before forming the second metal contact.

12. The method of claim 10, further comprising forming a dielectric liner in the first interconnect opening before forming the first metal contact.

13. The method of claim 10, wherein the nitridizing the sidewalls of the first interconnect opening formed by the first ILD layer includes exposing the first ILD layer to an $N_2$ plasma.

14. The method of claim 10, wherein the forming the second metal contact includes exposing the first ILD layer to a fluorine-based metal precursor.

15. The method of claim 10, further comprising:

forming a contact etch stop layer (CESL) over the first ILD layer;

forming the second ILD layer over the CESL; and extending the second interconnect opening through the CESL.

16. A method of forming an interconnect structure, the method comprising:

forming a dielectric layer having a nitrogen-containing crust; and forming a source/drain contact disposed in the dielectric layer, wherein the source/drain contact includes a metal plug and contact spacers, wherein the contact spacers are disposed between sidewalls of the metal plug and the nitrogen-containing crust of the dielectric layer.

17. The method of forming the interconnect structure of claim 16, wherein:

the dielectric layer includes silicon and oxygen;

the nitrogen-containing crust includes silicon, oxygen, and nitrogen;

the contact spacers include silicon and nitrogen; and the metal plug includes cobalt, ruthenium, or tungsten.

18. The method of forming the interconnect structure of claim 16, wherein the forming the dielectric layer having the nitrogen-containing crust includes:

depositing the dielectric layer;

thereafter, forming a source/drain contact opening in the dielectric layer, wherein the source/drain contact opening exposes a source/drain;

thereafter, performing a nitrogen plasma treatment on the dielectric layer to convert a portion of the dielectric layer into the nitrogen-containing crust, wherein a nitrogen concentration of the nitrogen-containing crust is about 3% to about 30%; and thereafter, forming the source/drain contact.

19. The method of forming the interconnect structure of claim 16, further comprising forming a source/drain via that extends below a top surface of the source/drain contact, wherein the contact spacers are further disposed between the source/drain via and the nitrogen-containing crust of the dielectric layer.

20. The method of forming the interconnect structure of claim 16, further comprising forming the contact spacers and the metal plug, such that the contact spacers abut both the metal plug and the nitrogen-containing crust of the dielectric layer.

* * * * *